United States Patent
Arikan

(10) Patent No.: US 11,894,859 B1
(45) Date of Patent: Feb. 6, 2024

(54) METHODS AND APPARATUS FOR DECODING OF POLAR CODES

(71) Applicant: Polaran Haberlesme Teknolojileri Anonim Sirketi, Ankara (TR)

(72) Inventor: Erdal Arikan, Ankara (TR)

(73) Assignee: Polaran Haberlesme Teknolojileri Anonim Sirketi, Cankaya (TR)

( * ) Notice: Subject to any disclaimer, the term of this patent is extended or adjusted under 35 U.S.C. 154(b) by 0 days.

(21) Appl. No.: 17/818,275

(22) Filed: Aug. 8, 2022

(51) Int. Cl.
    H03M 13/11 (2006.01)
    H03M 13/45 (2006.01)
    H03M 13/00 (2006.01)

(52) U.S. Cl.
    CPC ....... H03M 13/1108 (2013.01); H03M 13/45 (2013.01); H03M 13/612 (2013.01)

(58) Field of Classification Search
    CPC . H03M 13/1108; H03M 13/45; H03M 13/612
    See application file for complete search history.

(56) References Cited

U.S. PATENT DOCUMENTS

2015/0381208 A1* 12/2015 Li ................. H03M 13/616
                                                    714/755
2019/0245650 A1*  8/2019 Hui ............... H03M 13/2933

FOREIGN PATENT DOCUMENTS

WO     2019174739 A1    9/2019

OTHER PUBLICATIONS

E. Arikan, "Channel Polarization: A Method for Constructing Capacity-Achieving Codes for Symmetric Binary-Input Memoryless Channels," IEEE Transactions on Information Theory, vol. 55, No. 7, pp. 3051-3073, Jul. 2009.
A. Sural, et al., "Terabits-per-Second Throughput for Polar Codes," Workshop on Enabling Technologies for Terahertz Communications, 7 pages, PIMRC 2019.
I. Tal, et al., "List Decoding of Polar Codes," IEEE Transactions on Information Theory, vol. 61, No. 5, pp. 2213-2226, May 2015.
O. Afisiadis, et al., "A Low-Complexity Improved Successive Cancellation Decoder for Polar Codes," In 2014 48th Asilomar Conference on Signals, Systems and Computers, pp. 2116-2120, 2014.
L. Chandesris, et al., "Dynamic-SCFlip Decoding of Polar Codes," IEEE Transactions on Communications, vol. 66, No. 6, pp. 2333-2345, Jun. 2018.
F. Ercan, et al., "Partitioned Successive-Cancellation Flip Decoding of Polar Codes," In 2018 IEEE International Conference on Communications (ICC), 6 pages, 2018.

(Continued)

*Primary Examiner* — Thien Nguyen

(57) ABSTRACT

A team polar decoder (TPD) includes polar decoders (PPDs) connected to a channel, and a team decision maker (TDM) connected to the PPDs and a destination. Component polar decoders (CPDs) decode a polar code in accordance with a polar code. Each CPD receives a noisy code block (NCB) from the channel, and decodes the NCB in consecutive steps to obtain a decoded transform input block (DTIB). Each CPD is generates, at an end of the decoding step, a candidate decoded data block from the DTIB by a data-demapping operation that is an inverse of a data-mapping operation applied at a polar encoder, then sends the CDDB to the TDM, which receives the CDDBs from the PPDs, generates a decoded data block (DDB), and sends the DDB to the destination.

8 Claims, 11 Drawing Sheets

(56) References Cited

OTHER PUBLICATIONS

S. B. Korada, "Polar Codes for Channel and Source Coding," PhD Thesis, Ecole Polytechnique Federale de Lausanne, 181 pages, 2009.

International Search Report and Written Opinion of the International Searching Authority dated Nov. 27, 2023, in connection with International Application No. PCT/IB2023/057888, 12 pages.

\* cited by examiner

METHODS AND APPARATUS FOR DECODING OF POLAR CODES

TECHNICAL FIELD

The present disclosure is directed generally to decoding error correction codes in a communication system, more specifically, to high-throughput decoding of polar codes.

BACKGROUND

Next generation communication systems envisioned for Terahertz (THz) wireless communications require data throughputs from several hundred Gigabits/sec (Gb/s) to over one Terabits/sec (Tb/s). There is need for developing new forward error correction (FEC) codes that can be encoded and decoded at Tb/s throughputs while meeting hardware implementation constraints such as an energy efficiency of 1 pico-Joule per bit and area efficiency of 100 Gb/s per square millimeter of chip area. The present principles are concerned with achieving such goals.

In general, FECs are employed to eliminate or reduce errors that occur during transmission of data over noisy communication channels. A typical communication system with FEC coding comprises an encoder, a channel, and a decoder. The encoder encodes a source data block to produce a code block and transmits the code block over the channel. The channel produces a noisy version of the code block. In a well-designed FEC scheme, the code block is better protected against channel noise than the source data block from which the code block is derived, and with high probability the decoder is able to process the noisy version of the code block and produce a decoded data block which is an error-free copy of the source data block. The performance of a FEC scheme is typically measured by a frame error rate (FER), which is the probability that the decoded data block differs from the source data block.

A type of FEC code in prior art is a polar code. A basic type of decoder for polar codes is a successive cancellation (SC) decoder [1]. SC decoders are capable of achieving Tb/s data throughput with current VLSI technology [2].

A second type of prior-art decoder for polar codes is a successive cancellation list (SCL) decoder [3]. Polar codes under SCL decoding achieve a FER performance that is significantly better than that of SC decoding. Moreover, if a cyclic redundancy check (CRC) is attached to the source data block prior to polar encoding and a CRC-aided SCL (CA-SCL) decoder is used with a sufficiently large list size L, then polar codes achieve a FER performance that is competitive with other state-of-the-art FEC schemes. Unfortunately, the complexity of SCL decoders increases rapidly with the list size L, which renders such decoders impractical for applications that require Tb/s data throughputs.

There is need for polar decoders that achieve Tb/s throughputs like SC decoders and near state-of-the-art FER performance like SCL or CA-SCL decoders. The present principles target such polar decoders.

Polar coding may also include various types of decoders known as successive cancellation decoders with bit-flipping or SCF decoders for short (see, e.g., [4-6] and the references cited therein). A typical SCF decoder employs multiple SC decoders with each SC decoder generating a different decoding path in a polar code decoding tree. The decoding paths are configured to diverge from each other at various decision points so as to produce a diversity of decisions and improve the chances that one of the SC decoders finds the correct path. In SCF decoding, the choice of the decoding paths by individual SC decoders is governed by various types of decision rules that may be static (based on off-line calculations) or dynamic (depending on the current decoder input) or a combination of both.

Actually, the notion of an SCF decoder is broad enough to include any conceivable polar decoder as a special case. One may view SC and SCL decoders as extreme instances of an SCF decoder. There are also versions of SCF decoding that use multi-pass search procedures, which include search methods with backtracking as a special case. In this sense, belief propagation decoders and sequential decoders are also specific instances of SCF decoding.

The present principles introduce a new type of SCF decoder that prioritizes decoder throughput by keeping the simplicity of SC decoding in return for a certain degree of compromise from SCL decoder FER performance.

The present principles originate from a method called "randomized rounding", which was introduced in [7] to prove that polar codes achieve Shannon limits in the rate-distortion problem of information theory (source coding subject to a distortion criterion). The present principles adapt randomized rounding to the channel coding context and introduce a new type of decoder that we call randomized successive cancellation (RSC) decoder.

An individual RSC decoder is inferior to an SC decoder in terms of FER performance. The practical value of RSC decoding emerges when multiple RSC decoders are employed as a team. A team of RSC decoders, with each RSC decoder in the team operating autonomously, can achieve significantly better FER performance than a single SC decoder thanks to the diversity of decisions the team produces. Here, autonomous operation is important for reducing communications overhead among team members during decoding and thereby achieving high throughput. However, team RSC decoding suffers from practical problems such as the necessity of equipping each RSC decoder in the team with an independent random number generator. Furthermore, some decisions produced the team members may happen to be identical due to total lack of coordination, which in turn reduces diversity and leads to inefficient use of decoder resources.

The present principles remedy the practical deficiencies of team RSC decoding by defining a derandomized version of team RSC decoding. The present principles ensure that the component decoders in the team are able to operate deterministically and fully autonomously; while, collectively, they provide a full diversity of decisions and a FER performance significantly superior to that of a single SC decoder. Furthermore, the present principles ensure that each component decoder in the team has complexity comparable to that of a single SC decoder, which is important for achieving Tb/s data throughput.

REFERENCES

[1] E. Arikan, "Channel Polarization: A Method for Constructing Capacity-Achieving Codes for Symmetric Binary-Input Memoryless Channels," IEEE Transactions on Information Theory, vol. 55, no. 7, pp. 3051-3073, July 2009.

[2] A. Sural, E. G. Sezer, Y. Ertugrul, O. Arikan, and E. Arikan, "Terabits-per-Second Throughput for Polar Codes," Workshop on Enabling Technologies for Terahertz Communications, PIMRC 2019.

[3] I. Tal and A. Vardy, "List Decoding of Polar Codes," IEEE Transactions on Information Theory, vol. 61, no. 5, pp. 2213-2226, May 2015.

[4] O. Afisiadis, A. Balatsoukas-Stimming, and A. Burg. "A Low-Complexity Improved Successive Cancellation Decoder for Polar Codes." In 2014 48th Asilomar Conference on Signals, Systems and Computers, 2116-2120, 2014.

[5] L. Chandesris, V. Savin, and D. Declercq. "Dynamic-SCFlip Decoding of Polar Codes." IEEE Transactions on Communications 66, no. 6 (June 2018): 2333-2345.

[6] F. Ercan, C. Condo, S. A. Hashemi, and W. J. Gross. "Partitioned Successive-Cancellation Flip Decoding of Polar Codes." In 2018 IEEE International Conference on Communications (ICC), 1-6, 2018.

[7] S. B. Korada, "Polar Codes for Channel and Source Coding." PhD Thesis, Ecole Polytechnique Federale de Lausanne, 2009.

The above-listed publications are incorporated herein by reference.

SUMMARY

In one embodiment, a team polar decoder (TPD) apparatus for use in a communication system includes a plurality of polar decoders (PPDs) connected to a channel and a team decision maker (TDM) connected to the PPDs and a destination. The PPDs comprise an mth component polar decoder (CPD) for each value $m \in [1, M]$ of a CPD index, where M is a number of CPDs and $[1, M]$ is a CPD index set. The PPDs are configured to decode a polar code in accordance with a partition $(I_1, I_2, \ldots, I_S)$ of a polar code index set $[1, N]$, where N is a code length for the polar code and S is a partition size. For each $m \in [1, M]$, the mth CPD is configured to receive a noisy code block (NCB) y from the channel, and decode the NCB y in S consecutive steps to obtain an mth decoded transform input block (DTIB) $\hat{u}^{(m)} = (\hat{u}_1^{(m)}, \hat{u}_2^{(m)}, \ldots, \hat{u}_N^{(m)})$, where, for each $s \in [1, S]$, in an sth step of decoding, the mth CPD decodes an (m, s)th segment $\hat{u}_{I_s}^{(m)} = (\hat{u}_i^{(m)} : i \in I_s)$ of the mth DTIB On). For each $s \in [1, S]$, in the sth step of decoding, the mth CPD computes an (m, s)th metric $\gamma_s^{(m)}$ and decodes the (m, s)th segment $\hat{u}_{I_s}^{(m)}$ in accordance with an identifier $v_{I_s}$ of a subinterval in an (m, s−1)th partition of an (m, s−1)th interval into disjoint subintervals such that the subinterval with identifier $v_{I_s}$ contains an (m, s−1)th position variable $q_{s-1}^{(m)}$, where the (m, s−1)th partition of the (m, s−1)th interval is chosen in accordance with an (m, s)th splitting distribution $Q_s^{(m)}$, where the (m, s)th splitting distribution $Q_s^{(m)}$ is a probability distribution on a set of all possible values of the (m, s)th segment $\hat{u}_{I_s}^{(m)}$. The mth CPD is associated with an (m, s)th team $T_s^{(m)}$ for each $s \in [0, S]$, where the (m, s)th team $T_s^{(m)}$ is a subset of the CPD index set $[1, M]$, where, for $s \in [1, S]$, the (m, s)th team $T_s^{(m)}$ contains a CPD index $h \in [1, M]$ if and only if, for each $j \in [1, s]$, the (h, j)th segment $\hat{u}_{I_j}^{(h)}$ of the hth DTIB $\hat{u}^{(h)}$ decoded by the hth CPD has the same value as the (m, j)th segment $\hat{u}_{I_j}^{(m)}$ of the mth DTIB $\hat{u}^{(m)}$ decoded by the mth CPD, wherein the (m, 0)th team $T_0^{(m)}$ equals the CPD index set $[1, M]$. For any $s \in [1, 5]$, the (m, s)th metric $\gamma_s^{(m)}$, the (m, s−1)th interval, the (m, s−1)th partition of the (m, s−1)th interval, and the (m, s)th splitting distribution $Q_s^{(m)}$ are common to all members of the (m, s−1)th team $T_{s-1}^{(m)}$ in the sense that, for any CPD index $h \in T_{s-1}^{(m)}$, the (h, s)th metric $\gamma_s^{(h)}$ equals the (m, s)th metric $\gamma_s^{(m)}$, the (h, s−1)th interval equals the (m, s−1)th interval, the (h, s−1)th partition of the (h, s−1)th interval is the same as the (m, s−1)th partition of the (m, s−1)th interval, and the (h, s)th splitting distribution $Q_s^{(h)}$ is the same as the (m, s)th splitting distribution $Q_s^{(m)}$. For each $m \in [1, M]$ the mth CPD is further configured to generate, at an end of the Sth step of decoding, an mth candidate decoded data block (CDDB) $d^{(m)}$ from the mth DTIB $\hat{u}^{(m)}$ by a data-demapping operation and send the mth CDDB $\hat{d}^{(m)}$ to the TDM, where the data-demapping operation is an inverse of a data-mapping operation applied at a polar encoder (PE) (320) in the communication system, where the plurality of CDDBs $(\hat{d}^{(1)}, \hat{d}^{(2)}, \ldots, \hat{d}^{(M)})$ contain at least two distinct CDDBs. The TDM is configured to receive the plurality of CDDBs $(\hat{d}^{(1)}, \hat{d}^{(2)}, \ldots, \hat{d}^{(M)})$ from the PPDs, generate a decoded data block (DDB) $\hat{d}$, and send the DDB $\hat{d}$ to the destination.

In another embodiment, a method performed by a team polar decoder (TPD) apparatus in a communication system includes receiving, at a plurality of polar decoders (PPDs) connected to a channel, a noisy code block (NCB) y from the channel, and decoding, using a team decision maker (TDM) connected to the PPDs and a destination, the NCB y. The PPDs comprise an mth component polar decoder (CPD) for each value $m \in [1, M]$ of a CPD index, where M is a number of CPDs, wherein $[1, M]$ is a CPD index set. The PPDs are configured to decode a polar code in accordance with a partition $(I_1, I_2, \ldots, I_S)$ of a polar code index set $[1, N]$, where N is a code length for the polar code and S is a partition size. For each $m \in [1, M]$, the mth CPD is configured to receive the noisy code block (NCB) y from the channel, and decode the NCB y in S consecutive steps to obtain an mth decoded transform input block (DTIB) $\hat{u}^{(m)} = (\hat{u}_1^{(m)}, \hat{u}_2^{(m)}, \ldots, \hat{u}_N^{(m)})$, where, for each $s \in [1, S]$, in an sth step of decoding, the mth CPD decodes an (m, s)th segment $\hat{u}_{I_s}^{(m)} = (\hat{u}_i^{(m)} : i \in I_s)$ of the mth DTIB $\hat{u}^{(m)}$. For each $s \in [1, S]$, in the sth step of decoding, the mth CPD computes an (m, s)th metric $\gamma_s^{(m)}$ and decides the (m, s)th segment $\hat{u}_{I_s}^{(m)}$ in accordance with an identifier $v_{I_s}$ of a subinterval in an (m, s−1)th partition of an (m, s−1)th interval such that the subinterval with identifier $v_{I_s}$ contains an (m, s−1)th position variable $q_{s-1}^{(m)}$, where the (m, s−1)th partition of the (m, s−1)th interval is chosen in accordance with an (m, s)th splitting distribution $Q_s^{(m)}$, where the (m, s)th splitting distribution $Q_s^{(m)}$ is a probability distribution on a set of all possible values of the (m, s)th segment $\hat{u}_{I_s}^{(m)}$. The mth CPD is associated with an (m, s)th team $T_s^{(m)}$ for each $s \in [0, S]$, where the (m, s)th team $T_s^{(m)}$ is a subset of the CPD index set $[1, M]$, where, for $s \in [1, S]$, the (m, s)th team $T_s^{(m)}$ contains a CPD index $h \in [1, M]$ if and only if, for each $j \in [1, s]$, the (h, j)th segment $\hat{u}_{I_j}^{(h)}$ of the hth DTIB $\hat{u}^{(h)}$ decoded by the hth CPD has the same value as the (m, j)th segment $\hat{u}_{I_j}^{(h)}$ of the mth DTIB $\hat{u}^{(m)}$ decoded by the mth CPD, where the (m, 0)th team $T_0^{(m)}$ equals the CPD index set $[1, M]$. For any $s \in [1, S]$, the (m, s)th metric $\gamma_s^{(m)}$ the (m, s−1)th interval, and the (m, s−1)th partition of the (m, s−1)th interval are common to all members of the (m, s−1)th team $T_{s-1}^{(m)}$ in the sense that, for any CPD index $h \in T_{s-1}^{(m)}$, the (h, s)th metric $\gamma_s^{(h)}$ equals the (m, s)th metric $\gamma_s^{(m)}$ the (h, s−1)th interval equals the (m, s−1)th interval, the (h, s−1)th partition of the (h, s−1)th interval is the same as the (m, s−1)th partition of the (m, s−1)th interval, and the (h, s)th splitting distribution $Q_s^{(h)}$ is the same as the (m, s)th splitting distribution $Q_s^{(m)}$. For each $m \in [1, M]$, the mth CPD is further configured to generate, at an end of the Sth step of decoding, an mth candidate decoded data block (CDDB) $d^{(m)}$ from the mth DTIB $\hat{u}^{(m)}$ by a data-demapping operation and send the mth CDDB $\hat{d}^{(m)}$ to the TDM, where the data-demapping operation is an inverse of a data-mapping operation applied at a polar encoder (PE) in the communication system, where the plurality of CDDBs $(\hat{d}^{(1)}, \hat{d}^{(2)}, \ldots, \hat{d}^{(M)})$ contain at least two distinct CDDBs. The TDM is configured to receive the plurality of CDDBs ($\hat{d}^{(1)}, \hat{d}^{(2)}, \ldots, \hat{d}^{(M)}$) from the PPDs, generate a decoded data block (DDB) $\hat{d}$, and send the DDB $\hat{d}$ to the destination.

In any of the foregoing embodiments, for each $m \in [1, M]$, the mth CPD may be further configured to generate an mth reliability indicator (RI) $r^{(m)}$ and send mth RI $r^{(m)}$ to the TDM together with the mth CDDB $\hat{d}^{(m)}$, where the mth RI $r^{(m)}$ is a measure of confidence that the mth CDDB $\hat{d}^{(m)}$ equals a data block (DB) d produced by a source (310) in the communication system, and where the TDM is further configured to receive the plurality of RIs ($r^{(1)}, r^{(2)}, \ldots, r^{(m)}$) and utilize the plurality of RIs ($r^{(1)}, r^{(2)}, \ldots, r^{(m)}$) in generating the DDB $\hat{d}$.

In any of the foregoing embodiments, the PPDs are equipped with a total order relation. For $s \in [1, 5]$, the mth CPD is further configured to decode the (m, s)th segment $\hat{u}_{I_s}^{(m)}$ by setting the (m, s)th segment $\hat{u}_{I_s}^{(m)}$ equal to the smallest value $v_{I_s}$ with respect to the total order relation such that the inequality $q_{s-1}^{(m)} \le L_{s-1}^{(m)} \cdot \Sigma \tilde{v}_{I_s} \le v_{I_s} Q_{s-1}^{(m)}(\tilde{v}_{I_s})$ is satisfied by the (m, s−1)th position variable $q_{s-1}^{(m)}$, an (m, s−1)th team size variable $L_{s-1}^{(m)}$, and the (m, s)th splitting distribution $Q_s^{(m)}$, where the (m, s−1)th team size variable $L_{s-1}^{(m)}$ is a size of the (m, s−1)th team $T_{s-1}^{(m)}$, and where the sum $\Sigma \tilde{v}_{I_s} \le v_{I_s} Q_s^{(m)}(\tilde{v}_{I_s})$ is over all values of $\tilde{v}_{I_s}$ that are smaller than or equal to $v_{I_s}$ with respect to the total order relation.

In any of the foregoing embodiments, the code length and the partition size satisfy $S \ge N/8$ and the number of CPDs satisfies $M \ge 4$.

DETAILED DESCRIPTION

FIGS. 1 through 8, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged communication system.

Figure 1:
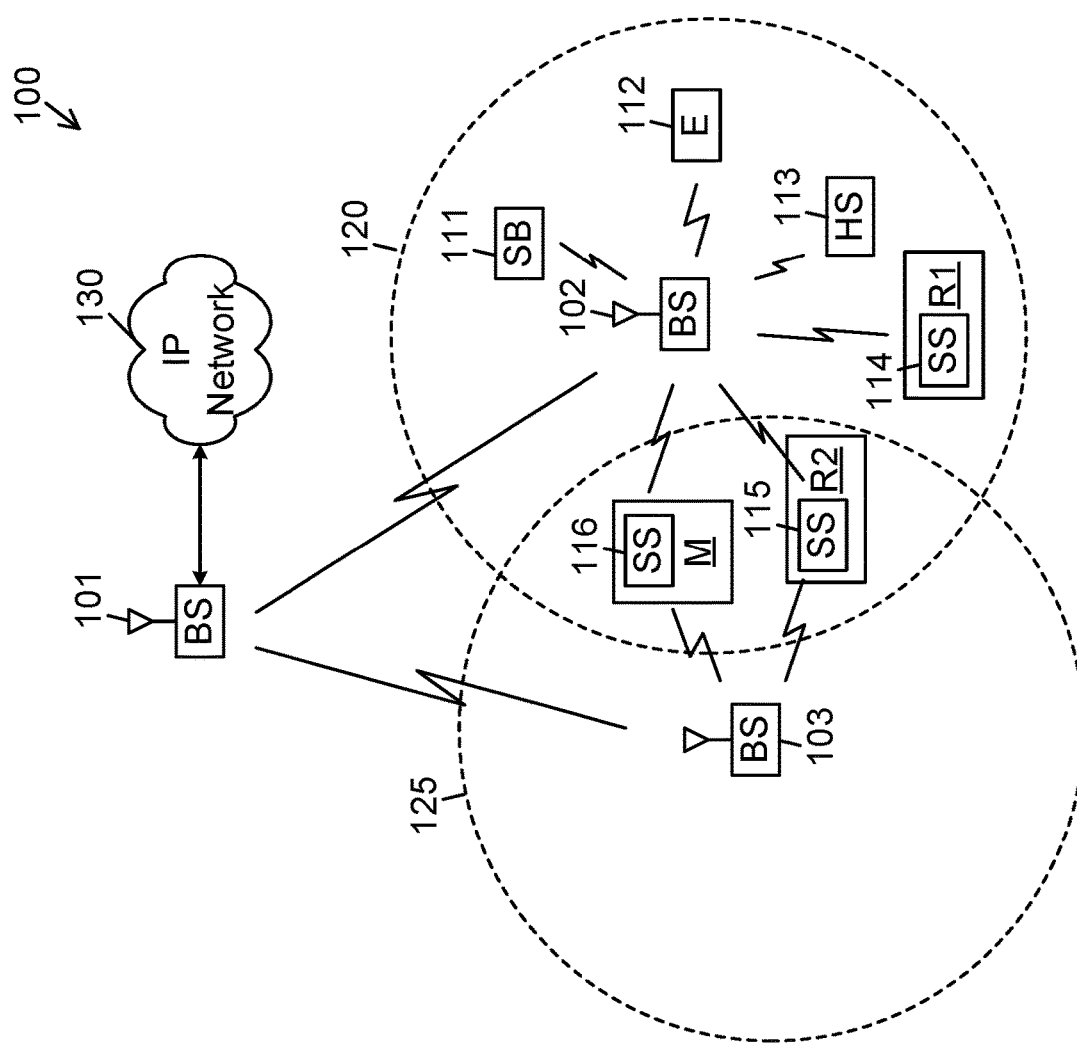
FIG. 1 illustrates an example wireless network within which embodiments of a team polar decoder may be used in accordance with certain aspects of the present disclosure.

FIG. 1 illustrates an example wireless network 100 within which embodiments of team polar decoding may be used according to certain aspects of the present disclosure. The embodiment of the wireless network 100 shown in FIG. 1 is for illustration only. Other embodiments of the wireless network 100 could be used without departing from the scope of the present disclosure. The wireless network 100 includes an eNodeB (eNB) 101, an eNB 102, and an eNB 103. The eNB 101 communicates with the eNB 102 and the eNB 103. The eNB 101 also communicates with at least one Internet Protocol (IP) network 130, such as the Internet, a proprietary IP network, or other data network.

Depending on the network type, other well-known terms may be used instead of "eNodeB" or "eNB," such as "base station", "BS", "gNodeB", or "access point." For the sake of convenience, the terms "eNodeB" and "eNB" are used in this patent document to refer to network infrastructure components that provide wireless access to remote terminals. Also, depending on the network type, other well-known terms may be used instead of "user equipment" or "UE," such as "mobile station" (or "MS"), "subscriber station" (or "SS"), "remote terminal," "wireless terminal," or "user device." For the sake of convenience, the terms "user equipment" and "UE" are used in this patent document to refer to remote wireless equipment that wirelessly accesses an eNB, whether the UE is a mobile device (such as a mobile telephone or smartphone) or is normally considered a stationary device (such as a desktop computer or vending machine).

The eNB 102 provides wireless broadband access to the network 130 for a first plurality of user equipments (UEs) within a coverage area 120 of the eNB 102. The first plurality of UEs includes a UE 111, which may be located in a small business (SB); a UE 112, which may be located in an enterprise (E); a UE 113, which may be located in a WiFi hotspot (HS); a UE 114, which may be located in a first residence (R1); a UE 115, which may be located in a second residence (R2); and a UE 116, which may be a mobile device (M) like a cell phone, a wireless laptop, a wireless personal digital assistant (PDA), tablet, or the like. The eNB 103 provides wireless broadband access to the network 130 for a second plurality of UEs within a coverage area 125 of the eNB 103. The second plurality of UEs includes the UE 115 and the UE 116. In some embodiments, one or more of the eNBs 101-103 may communicate with each other and with the UEs 111-116 using WiFi, WiMAX, 3G, 4G, long-term evolution (LTE), LTE-A, 5G, or other present or future advanced wireless communication techniques.

Dotted lines show the approximate extents of the coverage areas 120 and 125, which are shown as approximately circular for the purposes of illustration and explanation only. It should be clearly understood that the coverage areas associated with eNBs, such as the coverage areas 120 and 125, may have other shapes, including irregular shapes, depending upon the configuration of the eNBs and variations in the radio environment associated with natural and man-made obstructions.

As described in more detail below, one or more of eNB 101, eNB 102 and eNB 103 include 2D antenna arrays that can be used in conjunction with embodiments of the present disclosure. In some embodiments, one or more of eNB 101, eNB 102 and eNB 103 support the codebook design and structure for systems having 2D antenna arrays.

Although FIG. 1 illustrates one example of the wireless network 100, various changes may be made to FIG. 1. For example, the wireless network 100 could include any number of eNBs and any number of UEs in any suitable arrangement. Also, the eNB 101 could communicate directly with any number of UEs and provide those UEs with wireless broadband access to the network 130. Similarly, each eNB 102-103 could communicate directly with the network 130 and provide UEs with direct wireless broadband access to the network 130. Further, the eNB 101, 102, and/or 103 could provide access to other or additional external networks, such as external telephone networks or other types of data networks.

The example team polar decoding systems depicted in the figures and described below may be implemented in an eNB (such as eNB 102) and/or a UE (such as UE 116), as described in further detail below.

Figure 2A:
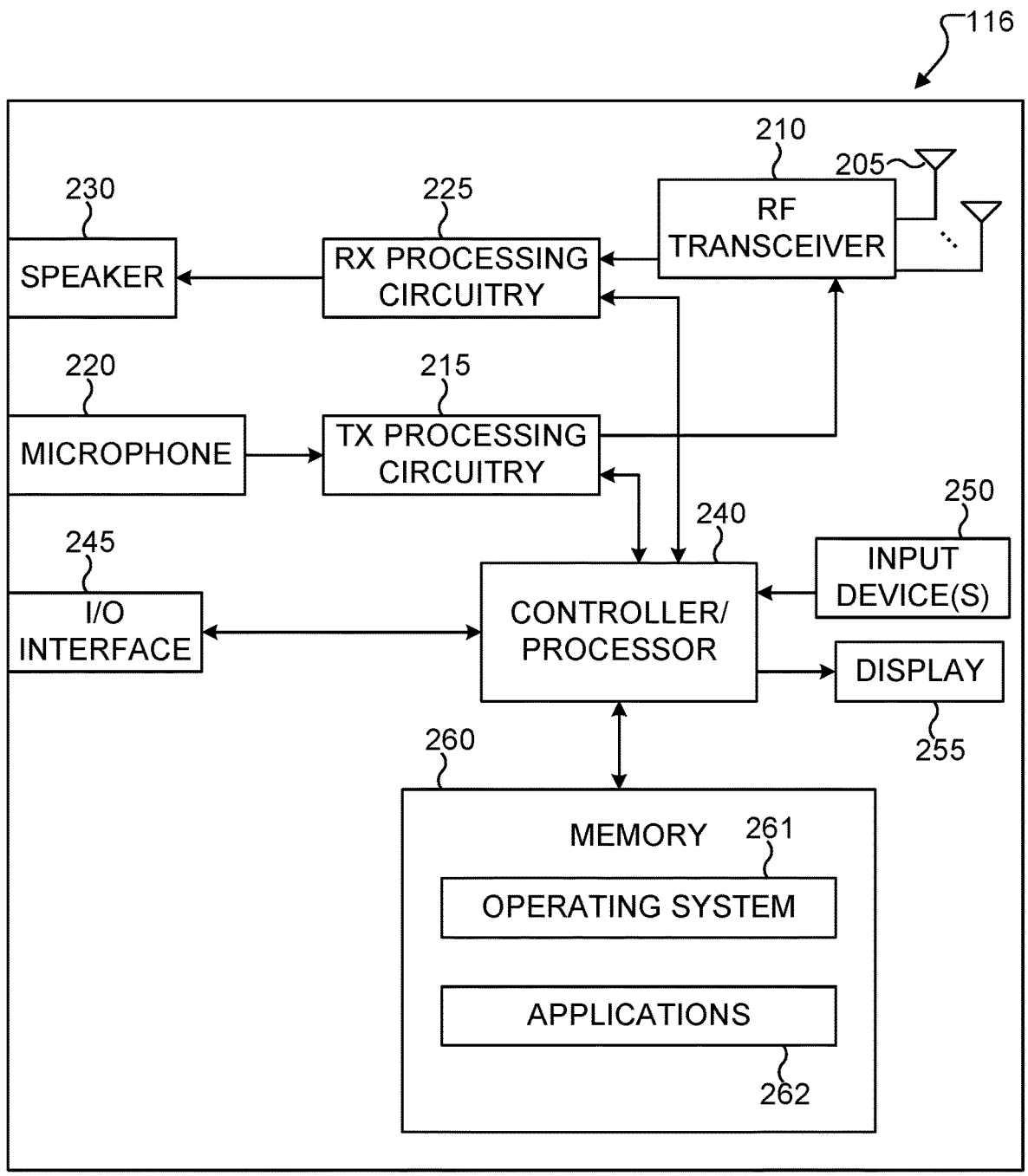
FIG. 2A illustrates an example user equipment network within which embodiments of a team polar decoder may be used in accordance with certain aspects of the present disclosure.

FIG. 2A illustrates an example user equipment network within which embodiments of team polar decoding may be used according to certain aspects of the present disclosure. The embodiment of the UE 116 illustrated in FIG. 2A is for illustration only, and the UEs 111-116 of FIG. 1 could have the same or similar configuration. However, UEs come in a wide variety of configurations, and FIG. 2A does not limit the scope of the present disclosure to any particular implementation of a UE.

The UE 116 includes an antenna 205, a radio frequency (RF) transceiver 210, a transmit (TX) processing circuitry 215, a microphone 220, and a receive (RX) processing circuitry 225. The UE 116 also includes a speaker 230, a controller/processor 240, an input/output (I/O) interface 245, input device(s) 250 (such as a keypad), a display 255, and a memory 260. The memory 260 includes a basic operating system (OS) program 261 and one or more applications 262. Either the OS program 261, one of the applications 262, or some combination thereof may implement programming for employing team polar decoding as described in the various embodiments herein.

The RF transceiver 210 receives, from the antenna 205, an incoming RF signal transmitted by an eNB of the network 100. The RF transceiver 210 may down-convert the incoming RF signal to generate an intermediate frequency (IF) or baseband signal which would be sent to the RX processing circuitry 225. The RX processing circuitry 225 transmits the processed signal to the speaker 230 (such as for voice data) or to the controller/processor 240 for further processing (such as for web browsing data).

The TX processing circuitry 215 receives, as at least some input data for the source data block, analog or digital voice data from the microphone 220 or other outgoing baseband data (such as web data, e-mail, or interactive video game data) from the controller/processor 240. The RF transceiver 210 receives the outgoing processed baseband or IF signal from the TX processing circuitry 215 and up-converts the baseband or IF signal to an RF signal that is transmitted via the antenna 205.

The controller/processor 240 can include one or more processors or other processing devices and execute the basic OS program 261 stored in the memory 260 in order to control the overall operation of the UE 116. For example, the controller/processor 240 could control the reception of forward channel signals and the transmission of reverse channel signals by the RF transceiver 210, the RX processing circuitry 225, and the TX processing circuitry 215 in accordance with well-known principles. In some embodiments, the controller/processor 240 includes at least one programmable microprocessor or microcontroller, while in other embodiments the main processor includes dedicated circuitry as well as (optionally) programmable logic or processing circuits.

The controller/processor 240 is also capable of executing other processes and programs resident in the memory 260, such as operations for channel quality measurement and reporting for systems having 2D antenna arrays. The controller/processor 240 can move data and/or instructions into or out of the memory 260 as required by an executing process. In some embodiments, the controller/processor 240 is configured to execute the applications 262 based on the OS program 261 or in response to signals received from eNBs or an operator. The controller/processor 240 is also coupled to the I/O interface 245, which provides the UE 116 with the ability to connect to other devices such as laptop computers and handheld computers. The I/O interface 245 is the communication path between these accessories and the controller/controller 240.

The controller/processor 240 is also coupled to the input device(s) 250 (which may simply be a single button or may be an array or other set of buttons) and the display 255. The operator of the UE 116 can use the input device(s) 250 to enter data into the UE 116. The display 255 may be a touch screen display or other display capable of rendering text and/or at least limited graphics, such as from web sites, and receiving touch inputs by a user in accordance with known practices.

The memory 260 is coupled to the controller/processor 240, and at least a part of the memory 260 could include a random access memory (RAM), and another part of the memory 260 could include a Flash memory or other read-only memory (ROM).

Although FIG. 2A illustrates one example of the UE 116, various changes may be made to FIG. 2A. For example, various components in FIG. 2A could be combined, further subdivided, or omitted and additional components could be added according to particular needs. As a particular example, the controller/processor 240 could be divided into multiple processors, such as one or more central processing units (CPUs), one or more application specific integrated circuits (ASICs), one or more field programmable gate arrays (FPGAs), and one or more graphics processing units (GPUs). Also, while FIG. 2A illustrates the UE 116 configured as a mobile telephone or smartphone, UEs could be configured to operate as other types of mobile or stationary devices.

Figure 2B:
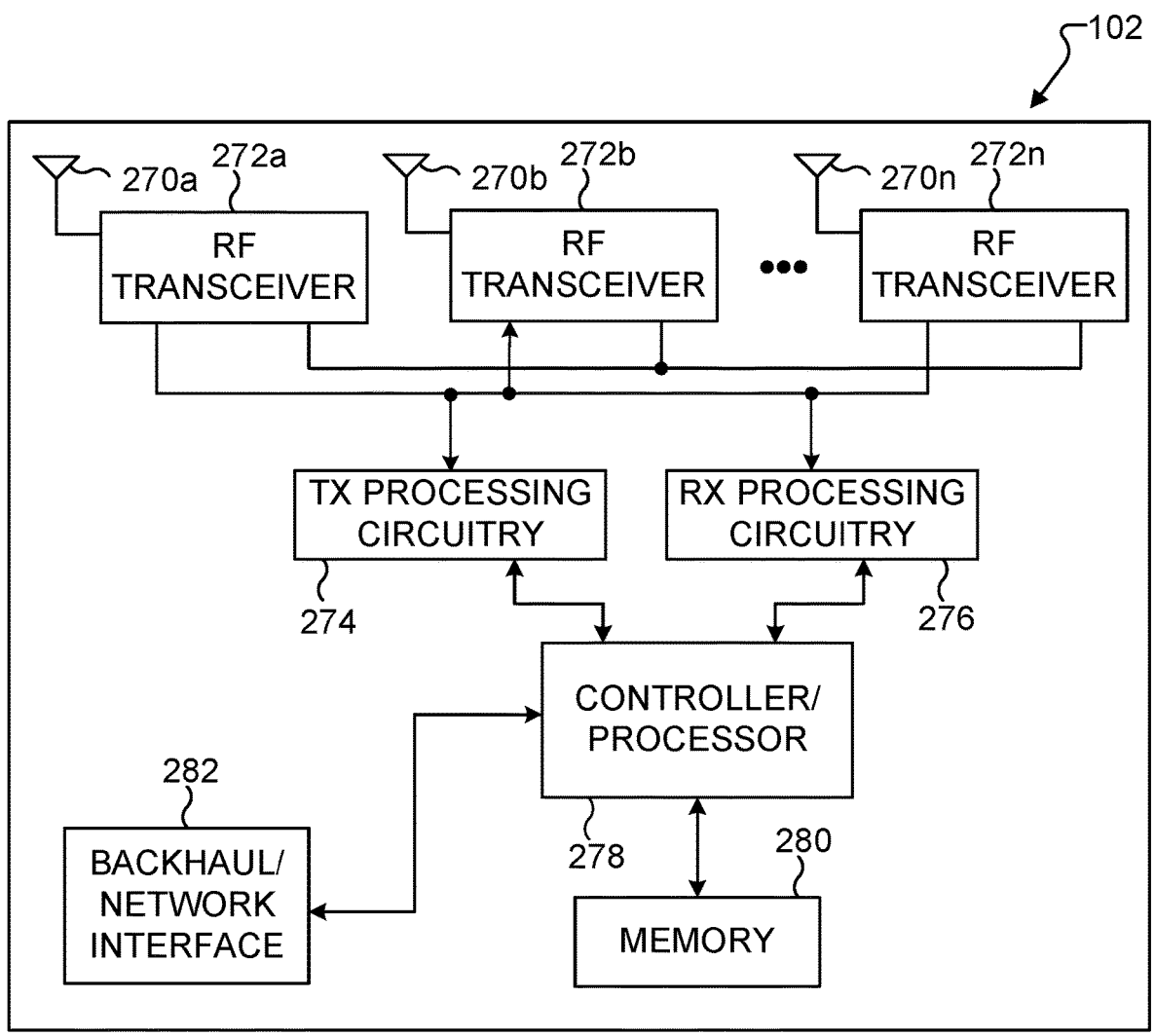
FIG. 2B illustrates an example enhanced NodeB (eNB) network within which embodiments of a team polar decoder may be used in accordance with certain aspects of the present disclosure.

FIG. 2B illustrates an example enhanced NodeB (eNB) network within which embodiments of team polar decoding may be used according to certain aspects of the present disclosure. The embodiment of the eNB 102 shown in FIG. 2B is for illustration only, and other eNBs of FIG. 1 could have the same or similar configuration. However, eNBs come in a wide variety of configurations, and FIG. 2B does not limit the scope of the present disclosure to any particular implementation of an eNB. It is noted that the eNB 101 and the eNB 103 can include the same or similar structure as the eNB 102.

As shown in FIG. 2B, the eNB 102 includes multiple antennas 270a-270n, multiple RF transceivers 272a-272n, a transmit (TX) processing circuitry 274, and a receive (RX) processing circuitry 276. In certain embodiments, one or more of the multiple antennas 270a-270n include 2D antenna arrays. The eNB 102 also includes a controller/processor 278, a memory 280, and a backhaul or network interface 282.

The RF transceivers 272a-272n receive, from the antennas 270a-270n, incoming RF signals, such as signals transmitted by UEs or other eNBs. The RF transceivers 272a-272n down-convert the incoming RF signals to generate IF or baseband signals. The IF or baseband signals are sent to the RX processing circuitry 276, which generates processed signals by filtering, decoding, and/or digitizing the baseband or IF signals. The RX processing circuitry 276 transmits the processed signals to the controller/processor 278 for further processing.

The TX processing circuitry 274 receives at least some input data. The TX processing circuitry 274 implements circuits to encode, multiplex, and/or digitize the outgoing baseband data to generate processed signals. The RF transceivers 272a-272n receive the outgoing processed signals from the TX processing circuitry 274 and up-converts the baseband or IF signals to RF signals that are transmitted via the antennas 270a-270n.

The controller/processor 278 can include one or more processors or other processing devices that control the overall operation of the eNB 102. For example, the controller/processor 278 could control the reception of forward channel signals and the transmission of reverse channel signals by the RF transceivers 272a-272n, the RX processing circuitry 276, and the TX processing circuitry 274 in accordance with well-known principles. The controller/processor 278 could support additional functions as well, such as more advanced wireless communication functions. Any of a wide variety of other functions could be supported in the eNB 102 by the controller/processor 278. In some embodiments, the controller/processor 278 includes at least one microprocessor or microcontroller, while in other embodiments the main processor includes dedicated circuitry (e.g., for controlling encoding and decoding processes, code puncturing and/or shortening processes, data mapping, etc.) as well as (optionally) programmable logic or processing circuits.

The controller/processor 278 is also capable of executing programs and other processes resident in the memory 280, such as a basic OS. The controller/processor 278 is also capable of supporting channel quality measurement and reporting for systems having 2D antenna arrays. In some embodiments, the controller/processor 278 supports communications between entities. The controller/processor 278 can move data and/or instructions into or out of the memory 280 as required by an executing process.

The controller/processor 278 is also coupled to the backhaul or network interface 282. The backhaul or network interface 282 allows the eNB 102 to communicate with other devices or systems over a backhaul connection or over a network. The interface 282 could support communications over any suitable wired or wireless connection(s). For example, when the eNB 102 is implemented as part of a cellular communication system (such as one supporting 3G, 4G, 5G, LTE, or LTE-A), the interface 282 could allow the eNB 102 to communicate with other eNBs over a wired or wireless backhaul connection. When the eNB 102 is implemented as an access point, the interface 282 could allow the eNB 102 to communicate over a wired or wireless local area network or over a wired or wireless connection to a larger network (such as the Internet). The interface 282 includes any suitable structure supporting communications over a wired or wireless connection, such as an Ethernet or RF transceiver.

The memory 280 is coupled to the controller/processor 278. Part of the memory 280 could include a RAM, and another part of the memory 280 could include a Flash memory or other ROM. In certain embodiments, a plurality of instructions is stored in memory. The instructions are configured to cause the controller/processor 278 to perform the systematic and/or non-systematic encoding or decoding processes, shortening processes, data mapping, etc.

Although FIG. 2B illustrates one example of the eNB 102, various changes may be made to FIG. 2B. For example, the eNB 102 could include any number of each component shown. As a particular example, an access point could include a number of interfaces 282, and the controller/processor 278 could support routing functions to route data between different network addresses. As another particular example, while shown as including a single instance of the TX processing circuitry 274 and a single instance of the Rx processing circuitry 276, the eNB 102 could include multiple instances of each (such as one per RF transceiver).

Notation. We list here some notation that will be used frequently in the rest of the disclosure. The notation $a \in A$ indicates that a is an element of a set A. For any two sets A and B, the notation $A \subset B$ means that A is a subset of B, i.e., every element of A is an element of B. A set A is called a proper subset of a set B if $A \subset B$ and there exists at least one element in B which is not an element in A. The notation A\B denotes set difference, i.e., the elements that are in A but not in B. For any set A, we write |A| to denote the size of A.

The notation $\emptyset$ denotes the empty set or an empty string or a vector with no elements depending on the context.

For a and b integers with $a \leq b$, the notation [a, b] denotes the set $\{a, a+1, \ldots, b\}$. For a and b integers with $a > b$, [a, b] denotes the empty set. For a an integer, [a] denotes the set $\{a\}$.

Given a discrete set A, we speak of a partition of A into subsets $(I_1, I_2, \ldots, I_a)$ if every element of A is contained in one and only one of the subsets, i.e., if $I_1 \cup I_2 \cup \ldots \cup I_a = A$ and $I_i \cap I_j = \emptyset$ for every pair of indices i and j satisfying $1 \leq i < j \leq a$.

The term partition is also used below in connection with subsets of continuous sets, such as intervals of numbers. In particular, we speak of a partition of an interval [b, c] for some pair of real numbers $c > b$ into subintervals $(I_1, I_2, \ldots, I_a)$ if $[b,c] = I_1 \cup I_2 \cup \ldots \cup I_a$, and $I_i \cap I_j = \emptyset$ for $1 \leq i \leq j \leq a$.

Following the convention in coding theory, we describe encoding and decoding operations in terms of vectors and matrices. Given a vector of the form $a = (a_1, a_2, \ldots, a_m)$, we say that a has length m, refer to the set [1, m] as the index set of a, and call $a_i$ the ith element or the ith coordinate of a. For any subset $A \subset [1, m]$ of indices of a, we write $a_A$ to denote the sub-vector $a_A = (a_i : i \in A)$ consisting of coordinates $a_i$ with indices in A, with the elements of a listed in increasing index order in $a_A$. For example, for $a = (a_1, a_2, \ldots, a_8)$ and $A = \{2, 5, 3, 8, 1\}$, we have $a_A = (a_1, a_2, a_3, a_5, a_8)$.

Figure 3:
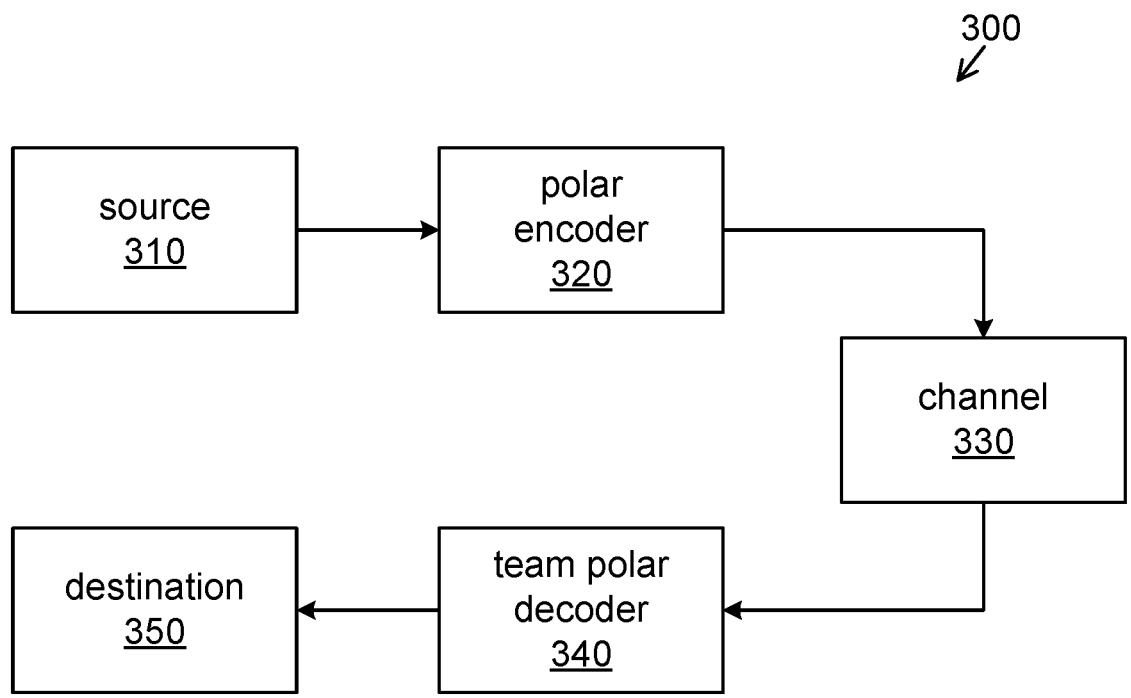
FIG. 3 is a block diagram illustrating a communication system within which embodiments of a team polar decoder may be used in accordance with certain aspects of the present disclosure.

FIG. 3 is a functional block diagram of a communication system 300 within which embodiments of the present principles may be implemented. The system 300 comprises a source 310, a polar encoder (PE) 320 connected to the source, a channel 330 connected to the PE 320, a team polar decoder (TPD) 340 connected to the channel 330, and a destination 350 connected to the TPD 340.

The source 310 generates a data block (DB) d sought to be communicated without error to the destination 350. The PE 320 receives the DB d, applies a data-mapping operation to the DB d to obtain a transform input block (TIB) u, applies a polar transform to the TIB u to obtain a code block (CB) x from a polar code, and transmits the CB x over the channel 330. The channel receives the CB x at a channel input and produces a noisy code block (NCB) y at a channel output. The TPD 340 receives the NCB y from the channel 330, decodes the NCB y in accordance with the present principles to generate a decoded data block (DDB) d̂, and sends the DDB d̂ to the destination 350.

The present principles are mainly concerned with the TPD 340, which itself comprises a plurality of polar decoders. However, before we discuss the details of the TPD 340, we need to discuss other aspects of the system 300 in some more detail. To that end, we now turn our attention to general characteristics of polar codes that can be used in the system 300.

In the description that follows, we will assume that the DB d, the TIB u, the CB x, the NCB y, and the DDB d̂ are vectors over their respective alphabets. Typically, the DB d, the TIB u, and the CB x take values over a finite field $\mathbb{F}_q$ for some prime power q. The NCB y takes values over a channel output alphabet, which may be discrete or continuous. Ordinarily, the DDB d̂ takes values over the same alphabet as the DB d, but we will also allow the DDB d̂ to take on additional values that may indicate abnormal decoder termination conditions such as decoder failure, decoder timeout, etc. The person skilled in the art will have no difficulty in applying the present principles to the cases where these assumptions about the alphabets are not exactly true. For example, the present principles can be readily adapted to the case, where the DB d takes values over the binary field $\mathbb{F}_2$ while the TIB u and the CB x take values over a non-binary field $\mathbb{F}_q$.

In terms of their elements, we will represent the DB as $d=(d_1, d_2, \ldots, d_K)$, the TIB as $u=(u_1, u_2, \ldots, u_N)$, the CB as $x=(x_1, x_2, \ldots, x_N)$, the NCB as $y=(y_1, y_2, \ldots, y_N)$, and the DDB as $\hat{d}=(\hat{d}_1, \hat{d}_2, \ldots, \hat{d}_K)$. We will refer to the length K of the DB d as a code dimension, to the length N of the CB x as a code length, and to the ratio K/N as a code rate. We will refer to the set [1, N] as a polar code index set.

In the following disclosure, we follow the convention in polar coding and represent the polar transform as a matrix operation x=uG, where G is an N-by-N polar transform matrix. Typically, the polar transform matrix has a Kronecker-power form $G=F^{\otimes n}$ with a kernel matrix $$F = \begin{bmatrix} 1 & 0 \\ 1 & 1 \end{bmatrix}$$

and some integer $n=\log_2 N$. Prior art also includes polar codes where the polar transform matrix is given by a Kronecker product $G=F_1 \otimes F_2 \otimes \ldots \otimes F_n$ of a plurality of (not necessarily identical) kernel matrices $F_i$, $1 \le i \le n$. Polar transforms of this more general type have the advantage of providing flexible transform dimensions. Prior art also includes polar transform matrices that are obtained by permuting the rows or columns of the polar transform matrices mentioned above. The present principles are applicable to polar codes defined by any such variation of the polar transform matrix.

For purposes of illustrating the present principles, we will need to consider specific polar code examples in the following description. We will introduce polar code examples by specifying a code alphabet $\mathbb{F}_q$ and a set of parameters (N, K, A, B, C, f, g, G), where N is the code length, K is the code dimension, (A, B, C) is a partition of the polar code index set [1, N], f is a frozen block (FB), g is a parity-check function (PCF), and G is the polar transform matrix. The partition (A, B, C) comprises a data index set A with size |A|=K, a frozen index set B, and a parity-check index set C. The FB f is a predetermined vector of length |B| over $\mathbb{F}_q$; and, the PCF g is a function that maps the DB d to a parity-check block (PCB) c of length |C| over $\mathbb{F}_q$. The polar transform matrix in the examples will be the standard polar transform $G=F^{\otimes n}$ over $\mathbb{F}_q$ with $$F = \begin{bmatrix} 1 & 0 \\ 1 & 1 \end{bmatrix}$$

and $n=\log_2 N$.

In the examples, we will consider non-systematic polar codes, although the present principles are applicable to both non-systematic and systematic polar codes. For a non-systematic polar code with parameters (N, K, A, B, C, f, g, G), encoding comprises receiving the DB d, computing the PCB c from the DB d by using the PCF g, preparing the TIB u in accordance with the partition (A, B, C) by setting $u_A$=d, $u_B$=f, $u_C$=c, and obtaining the CB x from the TIB u by the polar transform operation x=uG. In a systematic polar code, the DB d appears transparently as part of the CB x. Methods of systematic encoding of polar codes exist in prior art and will not be described here.

Prior art includes polar codes in which the PCB comprises a cyclic redundancy check (CRC) or some number of distributed parity checks (DPCs) or a combination of both. Prior art also includes polar codes, such as 5G polar codes, in which at least a portion of a CRC is used as DPCs. For a description of 5G polar codes we refer to the document "Multiplexing and channel coding," 3GPP 38.212 V.15.1.0, 2018. A CRC is typically used to detect decoding errors at the end of decoding while DPCs are typically employed to detect decoding errors during decoding. Upon early-detection of a decoding error, decoding may be terminated in order to save energy and/or reduce latency in initiating error recovery operations, such as asking for a retransmission in a hybrid automatic repeat request (HARQ) system. Any such polar code with a CRC or provision for HARQ belongs to the class of polar codes described above.

To discuss early detection of decoding errors further, it is useful to consider the PCF g as comprising a number of coordinate PCFs (CPCFs) $\{g_i : i \in C\}$, where an ith CPCF $g_i$ determines the ith coordinate $u_i$ of the TIB u. For any given $i \in C$, the ith CPCF $g_i$ will be particularly useful in early detection of decoding errors if $g_i$ is causal in the sense that gi determines $u_i$ in terms of the previously decoded elements of the TIB u, i.e., if $u_i = g_i(u_1, \ldots, u_{i-1})$. The present principles are compatible with and can take full advantage of both CRC- and DPC-type parity checks. The present principles can be employed with greater advantage if the PCF g comprises causal CPCFs.

The preceding definition of causality of a CPCF assumes that the TIB u is decoded in the natural decoding order, namely, in the order $u_1, u_2, \ldots, u_N$; if decoding is carried out in a different order, causality of a CPCF needs to be defined with respect to that decoding order. For example, if the elements of the TIB u are decoded in a permuted order it, then the coordinate $u_{\pi(i)}$ is causally determined by the CPCF $g_{u_{\pi(i)}}$ if $u_{\pi(i)} = g_{u_{\pi(i)}}(u_{\pi(1)}, \ldots, u_{\pi(i-1)})$.

Prior art includes polar coding schemes, such as 5G polar codes, that comprise rate-matching operations such as puncturing, shortening, or code extension at a transmitter and the corresponding rate-recovery operations at a receiver. For details of rate-matching and rate-recovery procedures for 5G polar codes, we refer to the article "Design of Polar Codes in 5G New Radio," ArXiv:1804.04389 [Cs, Math], Apr. 12, 2018, by Bioglio et al. In addition to rate-matching/recovery operations, 5G polar codes comprise certain other data processing operations such as interleaving/deinterleaving, scrambling/descrambling, and multiplexing/demultiplexing.

In the present disclosure, all such rate-matching/recovery and data processing operations on a polar code are regarded as part of the channel 330. Actually, the channel 330 in the present disclosure is defined in an even broader sense to include any functional blocks that typically exist between the PE 320 and the TPD 340 in an ordinary communication system but are not directly related to the present principles. For example, the channel 330 may comprise modulation/demodulation circuitry, digital-to-analog and analog-to-digital convertors, transmit and receive amplifiers, antennas, signal acquisition and synchronization circuitry, etc., in addition to essential channel components such as wireless or wireline media for data transmission or memory devices for data storage. The channel 330 may also comprise various data processing operations carried out on the CB x to produce the NCB y, such as extraction of soft information, calculation of log-likelihood ratios, etc.

This completes a general overview of the system 300 within which embodiments of the present principles can be employed. We now turn our attention to the details of the TPD 340, which is the main subject of the present principles.

Figure 4:
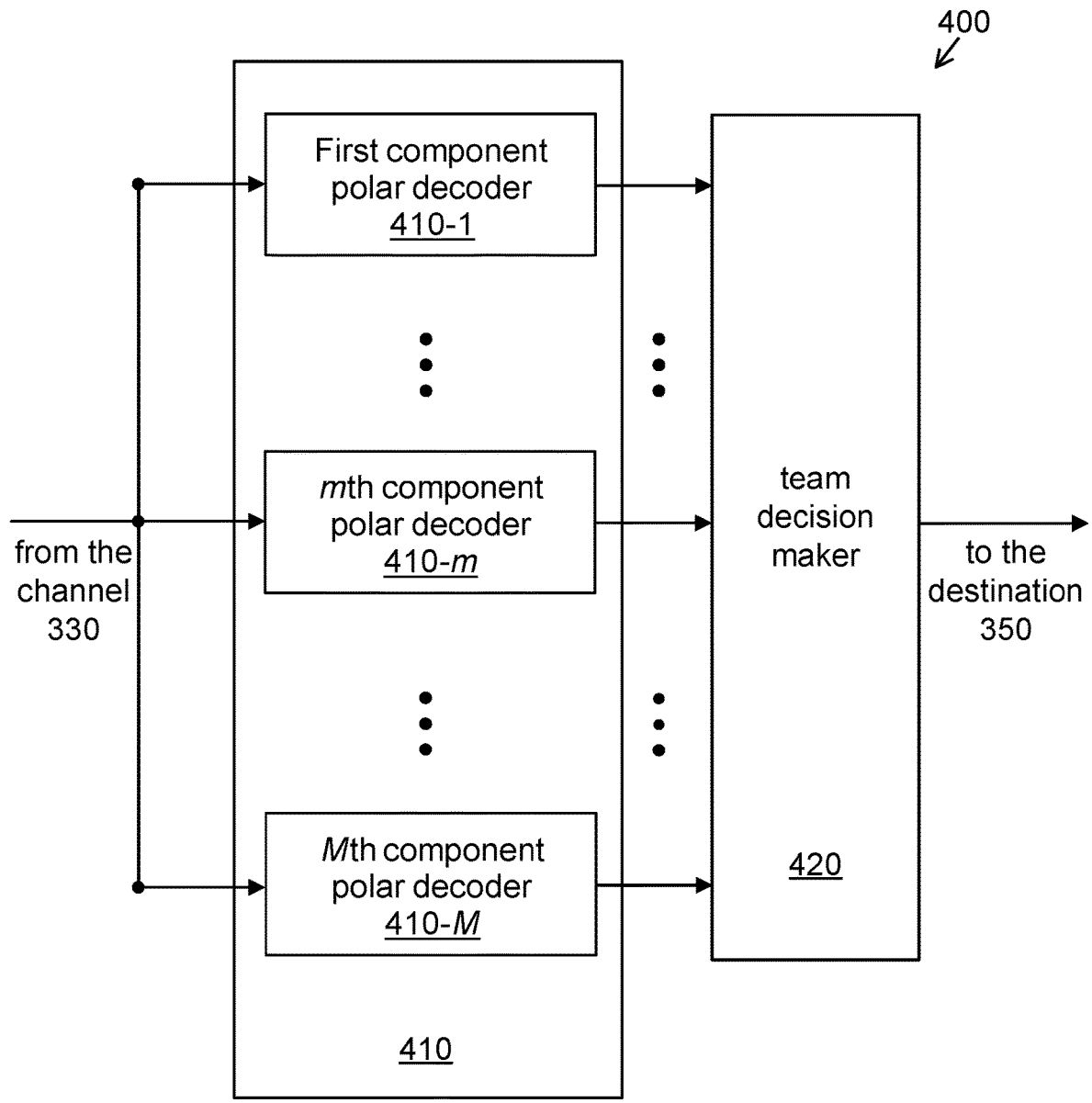
FIG. 4 is a block diagram illustrating a team polar decoder architecture according to certain aspects of the present disclosure.

FIG. 4 is a simplified block diagram 400 of the TPD 340 in accordance with certain aspects of the present principles. According to the diagram 400, the TPD 340 comprises a plurality of polar decoders (PPDs) 410 connected to the channel 330 and a team decision maker (TDM) 420 connected to the PPDs 410 and the destination 350. The PPDs 410 comprise an mth component polar decoder (CPD) 410-m for each value $m \in [1, M]$ of a CPD index, where M is a number of CPDs, and where [1, M] is a CPD index set.

Partition of the TIB into segments. The PPDs 410 are configured to decode the polar code encoded by the PE 320 in the system 300 in accordance with a partition $(I_1, I_2, \ldots, I_S)$ of the polar code index set [1, N], where N is the code length for the polar code and S is a partition size. The partition $(I_1, I_2, \ldots, I_S)$ divides the TIB u into S segments $(u_{I_1}, u_{I_2}, \ldots, u_{I_S})$, where $u_{I_s} = (u_i : i \in I_s)$ is an sth segment of the TIB u for each $s \in [1, S]$, S is a partition size, and [1, S] is a partition index set.

For each $m \in [1, M]$, the mth CPD 410-m is configured to receive the NCB y from the channel 330, and decode the NCB y in S consecutive steps to obtain an mth decoded transform input block (DTIB) $\hat{u}^{(m)} = (\hat{u}_1^{(m)}, \hat{u}_2^{(m)}, \ldots, \hat{u}_N^{(m)})$, wherein, for each $s \in [1, S]$, in an sth step of decoding, the mth CPD 410-m decodes an (m, s)th segment $\hat{u}_{I_s}^{(m)} = (\hat{u}_i^{(m)} : i \in I_s)$ of the mth DTIB $\hat{u}^{(m)}$.

If each CPD in the PPDs 410 carries out decoding in the natural index order, a preferred method of choosing the partition $(I_1, I_2, \ldots, I_S)$ is to set $I_s = [i_{s-1}+1, i_s]$ where $\{i_0, i_1, \ldots, i_S\}$ is a monotone increasing collection of integers with $i_0 = 0 < i_1 < \ldots < i_S = N$. A special case is S=N, where $I_s = \{s\}$ for each $s \in [1, N]$, as in ordinary SC decoding.

In some embodiments of the present principles, each CPD in the PPDs 410 may carry out decoding in a permuted index order π. In such cases, the partition $(I_1, I_2, \ldots, I_S)$ may be chosen as the image under the permutation π of a preferred partition designed for natural index order decoding. In other words, one may choose $(I_1, I_2, \ldots, I_S)$ so that, for each $s \in [1, S]$, one has $I_s = \{\pi(i_{s-1}+1), \pi(i_{s-1}+2), \ldots, \pi(i_s)\}$, where $\{i_0, i_1, \ldots, i_S\}$ is a set of integers satisfying $i_0 = 0 < i_1 < \ldots < i_S = N$.

The person skilled in the art will recognize that the preferred method given here for selecting each partition element $I_s$ so as to consist of successive symbols (defined by the decoding order) is advantageous since it allows the PPDs 410 to use recursive decoding methods that are well known in polar coding. However, the present principles as described in the present disclosure are applicable regardless of how the partition $(I_1, I_2, \ldots, I_S)$ is chosen.

The goal behind using the partition $(I_1, I_2, \ldots, I_S)$ is to reduce the decoder latency, relative to a symbol-by-symbol decoder, roughly by a factor of N/S. However, using partitions with large speed-up factors N/S comes at the cost of a rapid increase in logic complexity. We expect that the present principles will be useful mainly when the partition size S grows in proportion to the code length N, such as $S \geq N/8$, so as to provide a practically meaningful tradeoff between implementation complexity and decoding latency.

Partition of the PPDs into teams. A key concept underlying the present principles is the notion of a team. For each $m \in [1, M]$ and $s \in [0, S]$, we associate an (m, s)th team $T_s^{(m)}$ with the mth CPD 410-m, where the (m, s)th team $T_s^{(m)}$ is a subset of the CPD index set [1, M]. For $s \in [1, S]$, we define the (m, s)th team $T_s^{(m)}$ so that a CPD index $h \in [1, M]$ belongs to $T_s^{(m)}$ if and only if, for each $j \in [1, s]$, the (h, j)th segment $\hat{u}_{I_j}^{(h)}$ of the hth DTIB $\hat{u}^{(h)}$ decoded by the hth CPD has the same value as the (m, j)th segment $\hat{u}_{I_j}^{(m)}$ of the mth DTIB $\hat{u}^{(m)}$ decoded by the mth CPD. For each $m \in [1, M]$ and s=0, we define the (m, 0)th team $T_0^{(m)}$ as the entire CPD index set, i.e., $T_0^{(m)} = [1, M]$.

For each $m \in [1, M]$, the successive teams that the mth CPD belongs to are nested in the sense that $T_0^{(m)} \supset T_1^{(m)} \supset \ldots \supset T_S^{(m)}$. This nesting property is a consequence of the fact that, under the present principles, the mth CPD 410-m never revises an earlier decision. Not all polar decoder architectures employing a plurality of component polar decoders possess this nested-teams property. For example, SCL decoders that continually reassign component polar decoders to more promising decoding tasks, cannot be described in terms of a sequence of nested teams. Likewise, Fano-style sequential decoders that carry out depth-first search with backtracking cannot be described by nested teams. The nested-teams property narrows the scope of decoder architectures in return for lower implementation complexity and higher decoder throughput.

It is immediate from the definitions that, for any fixed $s \in [0, S]$ and for any two CPD indexes m, $h \in [1, M]$, the teams $T_s^{(m)}$ and $T_s^{(h)}$ are either identical or disjoint. We say that the mth CPD and the hth CPD are teammates at level s if $T_s^{(m)} = T_s^{(h)}$. At level 0, all CPDs are teammates since $T_0^{(m)} = [1, M]$ for all $m \in [1, M]$.

Teammate relationship at any fixed level $s \in [0, S]$ is an equivalence relationship; it satisfies the reflexivity, symmetry, and associativity properties. Thus, the teammate relationship at level s partitions the CPD index set [1, M] into equivalence classes. We denote the equivalence classes at level $s \in [0, S]$ by $T(v_{I_1}, \ldots, v_{I_s})$, where $(v_{I_1}, \ldots, v_{I_s})$ ranges through all possible values of the firsts segments $(u_{I_1}, \ldots, u_{I_s})$ of the TIB u. For any $m \in [1, M]$, the mth CPD belongs to the equivalence class $T(v_{I_1}, \ldots, v_{I_s})$ if $\hat{u}_{I_j}^{(m)}$ equals $v_{I_j}$ for each $j \in [1, s]$. For s=0, there is only one non-empty equivalence class, namely, T(0)=[1, M]. Clearly, at each level s, there can be at most M non-empty equivalence classes. Henceforth, we drop the distinction between equivalence classes and teams and refer to both as teams. In other words, we identify the (m, s)th team $T_s^{(m)}$ with the equivalence class $T(\hat{u}_{I_1}^{(m)}, \ldots, \hat{u}_{I_s}^{(m)})$ for each $m \in [1, M]$ and $s \in [0, S]$.

The members of a team $T(v_{I_1}, \ldots, v_{I_{s-1}})$ share a common decoding history until and including the (s-1)th step of decoding, $s \in [1, S]$. The present principles ensure that, for each $m \in [1, M]$, the mth CPD 410-m is able to keep track of the composition of the team $T(\hat{u}_{I_1}^{(m)}, \ldots, \hat{u}_{I_{s-1}}^{(m)})$ that the mth CPD 410-*m* belongs to at each step $s \in [1, S]$ of the decoding process. The present principles exploit this shared information among members of each team $T(v_{I_1}, \ldots, v_{I_{s-1}})$ to coordinate actions of the corresponding team members in the sth step of decoding. In general, such coordination can take many forms. As already stated above, in embodiments of the present principles, the coordination is based on a common metric, a common interval, and a common splitting distribution. In addition to these common variables, each CPD uses a unique position variable to distinguish itself from its teammates in choosing its next decision.

Probabilistic model. The present principles require a specific probabilistic model of the system 300 when one considers various embodiments. The probabilistic model that we use here comprises a joint ensemble (U, Y) where $U = (U_1, U_2, \ldots, U_N)$ and $Y = (Y_1, Y_2, \ldots, Y_N)$ are random vectors corresponding, respectively, to the TIB $u = (u_1, u_2, \ldots, u_N)$ and the NCB $y = (y_1, y_2, \ldots, y_N)$ in the system 300. According to the probabilistic model, the TIB and the NCB take a pair of values (u, y) with a probability $P_{U,Y}(u, y)$, where $P_{U,Y}$ denotes the joint probability assignment over the ensemble (U, Y) using standard probability theory notation. As usual, the probability assignment $P_{U,Y}(u, y)$ can be factored as $P_U(u)P_{Y|U}(y|u)$, where $P_U(u)$ is a probability assignment on the TIB random vector U and $P_{Y|U}(y|u)$ is a conditional probability assignment that depends on the channel 330.

We follow the standard practice in polar coding and use a probabilistic model in which $P_U(u)$ is the uniform distribution over the range of the TIB random vector U. The assumption that $P_U(u)$ is uniform reduces the complexity of computing various probabilities of interest at the PPDs 410; however, it ignores the fact that some coordinates of the TIB random vector U are frozen or constrained by parity-check relations.

As for $P_{Y|U}(y|u)$, we again follow standard polar coding practice and set $P_{Y|U}(y|u) = W_N(y|x)$ where $x = uG$ is the CB corresponding to the TIB u and $W_N$ is a model for the transition probabilities of the channel 330 over input-output blocks of length N. In some embodiments of the present principles, the channel 330 may be modeled as memoryless, in which case we have a product-form conditional probability assignment $W_N(y|x) = \Pi_{i=1}^{N} W(y_i|x_i)$ where W is a channel transition probability assignment over a single use of the channel 330. In some embodiments, the channel 330 may be modeled in the form $W_N(y|x) = \Pi_{i=1}^{N} W^{(i)}(y_i|x_i)$, which retains the product-form (memoryless) property but allows the channel 330 to be time-varying, with $W^{(i)}$ representing a channel transition probability assignment at the ith use of the channel 330. A time-varying channel model is useful for modeling fading phenomenon in wireless communications; it is also useful for representing the effects of rate-matching/recovery operations as part of the channel 330. The person skilled in the art will have no difficulty in adapting the present principles to more general channel models based on the illustrative embodiments that are given below.

The probabilistic model $P_{U,Y}(u, y)$ specified above makes it possible to define an sth a-posteriori probability (APP) $P(u_{I_s}|y, u_{I_1}, \ldots, u_{I_{s-1}})$, where the sth APP is the conditional probability of the event $\{U_{I_s} = u_{I_s}\}$ given the events $\{Y = y\}$ and $\{(U_{I_1}, \ldots, U_{I_{s-1}}) = (u_{I_1}, \ldots, u_{I_{s-1}})\}$. The sth APP is computed by ignoring any constraints (frozen symbols and parity-check relations) imposed by the polar code on the future segments $U_{I_s}, \ldots, U_{I_S}$ of the TIB random variable U. Taking polar code constraints into full account in computing the APPs would be equivalent to maximum-likelihood (ML) decoding, which is optimal but prohibitively complex in most situations.

A partial compromise from ML decoding is to take into account only code constraints in a certain look-ahead window. To that end, the present principles associate a collection of constraint windows $(J_1, J_2, \ldots, J_S)$ with the partition $(I_1, I_2, \ldots, I_S)$, where, for each $s \in [1, S]$, there is an sth constraint window $J_s$ such that $I_1 \cup I_2 \cup \ldots \cup I_s \subset J_s$ and the constraint windows are nested in the sense that $J_{s-1} \subset J_s$, with the notational convention that $J_0 = \emptyset$. We will use the notation $C_{J_s}$ to denote the set of constraints imposed by the polar code structure on the coordinates $U_{J_s}$ of the TIB random vector U and refer to $C_{J_s}$ as an sth set of code constraints. We will refer to the set $H_s = J_s \setminus (I_1 \cup I_2 \cup \ldots \cup I_S)$ as an sth look-ahead window. If $J_s = I_1 \cup I_2 \cup \ldots \cup I_s$, then the sth look-ahead window $H_s$ is empty and the sth set of code constraints $C_{J_s}$ covers only the code constraints on an sth prefix $(U_{I_1}, \ldots, U_{I_s})$ of the TIB random vector U. At the other extreme, one may have $J_s = [1, N]$, in which case there is full look-ahead and the sth set of code constraints $C_{J_s}$ covers all code constraints, as in ML decoding. In order to keep the complexity of implementation within practical limits, the sizes of the look-ahead windows $H_s$ have to be chosen sufficiently small.

Combining the notions of the sth APP and the sth set of code constraints $C_{J_s}$ we define an sth code-constrained APP (CC-APP) $P(u_{I_s}|y, u_{I_1}, \ldots, u_{I_{s-1}}, C_{J_s})$ as the conditional probability of the event $\{U_{I_s} = u_{I_s}\}$ given the events $\{Y = y\}$, $\{(U_{I_1}, \ldots, U_{I_{s-1}}) = (u_{I_1}, \ldots, u_{I_{s-1}})\}$, and the code constraints $C_{J_s}$. If $u_{I_s}$ is not compatible with y, $u_{I_1}, \ldots, u_{I_{s-1}}$, and $C_{J_s}$, then the sth CC-APP $P(u_{I_s}|y, u_{I_1}, \ldots, u_{I_{s-1}}, C_{J_s})$ equals zero; otherwise, the sth CC-APP $P(u_{I_s}|y, u_{I_1}, \ldots, u_{I_{s-1}}, C_{J_s})$ equals a normalization constant times the sth APP $P(u_{I_s}|y, u_{I_1}, \ldots, u_{I_{s-1}})$.

Partitioning a team by partitioning an interval. In the sth step of decoding, the mth CPD 410-*m* computes an (m, s)th metric $\gamma_s^{(m)}$ and decodes the (m, s)th segment $\hat{u}_{I_s}^{(m)}$ in accordance with an identifier $v_{I_s}$ of a subinterval in an (m, s−1)th partition of an (m, s−1)th interval into disjoint subintervals such that the subinterval with identifier $v_{I_s}$ contains an (m, s−1)th position variable $q_{s-1}^{(m)}$, wherein, for any $s \in [1, S]$, the (m, s)th metric $\gamma_s^{(m)}$ the (m, s−1)th interval, the (m, s−1)th partition of the (m, s−1)th interval, and the (m, s)th splitting distribution $Q_s^{(m)}$ are common to all members of the (m, s−1)th team $T_{s-1}^{(m)}$ in the sense that, for any CPD index $h \in T_{s-1}^{(m)}$, the (h, s)th metric $\gamma_s^{(h)}$ equals the (m, s)th metric $\gamma_s^{(m)}$, the (h, s−1)th interval equals the (m, s−1)th interval, the (h, s−1)th partition of the (h, s−1)th interval is the same as the (m, s−1)th partition of the (m, s−1)th interval, and the (h, s)th splitting distribution $Q_s^{(h)}$ is the same as the (m, s)th splitting distribution $Q_s^{(m)}$. On the other hand, the (m, s−1)th position variable $q_{s-1}^{(m)}$ may depend on the CPD index m.

For each $m \in [1, M]$, the mth CPD 410-*m* is further configured to generate, at the end of the Sth step of decoding, an mth candidate decoded data block (CDDB) $d^{(m)}$ from the mth DTIB $\hat{u}^{(m)}$ by a data-demapping operation and send the mth CDDB $\hat{d}^{(m)}$ to the TDM 420. The data-demapping operation is an inverse of the data-mapping operation applied at the PE 320. Details of the data-demapping operation may vary depending on whether the polar code in the system 300 is encoded in systematic or non-systematic manner. Regardless of how the data-mapping is done at the PE 320, the mth CPD 410-*m* is configured to recover the mth CDDB $\hat{d}^{(m)}$ from mth DTIB $\hat{u}^{(m)}$ correctly if the mth DTIB $\hat{u}^{(m)}$ is an error-free reconstruction of the TIB u.

The present principles aim to ensure that the plurality of CDDBs ($\hat{d}^{(1)}, \hat{d}^{(2)}, \ldots, \hat{d}^{(M)}$) are all distinct so as to provide maximum diversity. Having the plurality of CDDBs ($\hat{d}^{(1)}, \hat{d}^{(2)}, \ldots, \hat{d}^{(M)}$) all distinct may be impossible in some trivial cases, e.g., when the code rate is so low that the number of all possible code blocks is less than the number of CPDs M. To exclude such trivial special cases, the present principles are restricted to the configurations where the plurality of CDDBs ($\hat{d}^{(1)}, \hat{d}^{(2)}, \ldots, \hat{d}^{(M)}$) contain at least two distinct CDDBs.

The TDM 420 is configured to receive the plurality of CDDBs ($\hat{d}^{(1)}, \hat{d}^{(2)}, \ldots, \hat{d}^{(M)}$) from the PPDs 410, generate the DDB $\hat{d}$, and send the DDB $\hat{d}$ to the destination 350. The DDB $\hat{d}$ is typically set equal to one of the plurality of CDDBs, but this does not always have to be the case. For example, the DDB $\hat{d}$ may be set to an erasure symbol when all of the plurality of CDDBs are detected to be in error.

In typical embodiments of the present principles, for each $m \in [1, M]$, the mth CPD 410-m is further configured to generate an mth reliability indicator (RI) $r^{(m)}$ and send the RI $r^{(m)}$ to the TDM 420 together with the mth CDDB $\hat{d}^{(m)}$, wherein the mth RI $r^{(m)}$ is a measure of confidence that the mth CDDB $\hat{d}^{(m)}$ equals the DB d produced by the source (310) in the communication system 300. When the embodiment comprises RIs, the TDM 420 is further configured to receive the plurality of RIs ($r^{(1)}, r^{(2)}, \ldots, r^{(M)}$) and utilize the plurality of RIs ($r^{(1)}, r^{(2)}, \ldots, r^{(M)}$) in generating the DDB d.

A preferred method of calculating the mth RI $r^{(m)}$ is to produce an mth decoded code block (DCB) $\hat{x}^{(m)}$ by computing the polar transform $\hat{x}^{(m)} = \hat{u}^{(m)}G$ of the mth DTIB $\hat{u}^{(m)}$, and setting $r^{(m)}$ equal to $W_N(y|\hat{x}^{(m)})$ or some function thereof, where $W_N(y|\hat{x}^{(m)})$ is a conditional probability that the NCB y is received at the output of the channel 330 given that the mth DCB $\hat{x}^{(m)}$ is transmitted at the input of the channel 330. In some embodiments of the present principles, there may be a CRC built into the TIB u; if so, the mth CPD 410-m applies a CRC check on the mth DTIB $\hat{u}^{(m)}$, and sets the mth RI $r^{(m)}$ to a special value that indicates a detected error when the CRC check fails.

This completes our discussion of general operational aspects of the TPD 340 in accordance with various aspects of the present principles. As a summary, we note that partitions play a key role in the present principles. There are three types of partitions. First, the polar code index set [1, N] is a partitioned into subsets ($I_1, I_2, \ldots, I_S$) with the goal of reducing the number of decoder decision steps. Second, there is a partition of the PPDs into a system of nested sequences of teams. Third, each decision at each CPD is generated in accordance with a partition of an interval using a splitting distribution. The second and third types of partitions are not independent of each other; the third type of partition is the underlying mechanism by which the second type of partition (the system of nested teams) is generated.

Since the present principles aim at achieving an improved performance relative to SC decoding, the present principles are expected to be useful particularly when the number of CPDs is significantly greater than, for example, when $M \geq 4$. In the rest of the description, we will focus on specific preferred embodiments.

A first embodiment of the present principles. In the first embodiment, the (m, s)th metric $\gamma_s^{(m)}(v_{I_s})$ at a possible value $v_{I_s}$ of the (m, s)th segment $\hat{u}_{I_s}^{(m)}$ is chosen as the logarithm of the (m, s)th CC-APP $P(V_{I_s}|y, \hat{u}_{I_1}^{(m)}, \ldots \hat{u}_{I_{s-1}}^{(m)}, C_{J_s})$. We note that $\gamma_s^{(m)}$ defined in this way is team-invariant in the sense that, for any $h \in [1, M]$, if the hth CPD is a teammate of the mth CPD at level (s−1), i.e., if $h \in T_s^{(m)}$, then the (h, s)th metric $\gamma_s^{(h)}$ is identical to the (m, s)th metric $\gamma_s^{(m)}$.

Using logarithmic metrics has the advantage of reducing the dynamic range of the metric values, which makes it possible to represent the metric with fewer number of bits, which in turn helps reduce circuit complexity and memory requirements in hardware or software implementations. However, the present principles can be used with a broad variety of metrics, which may be logarithmic or non-logarithmic. The person skilled in the art of polar coding will have no difficulty in adapting other metrics that have been used in prior art on polar coding to the present principles. Some of the metrics in question may involve approximations, such as the "min-sum" approximation.

In the first embodiment, we take the (m, s)th splitting probability distribution $Q_s^{(m)}$ as the sth CC-APP $P(\cdot|y, \hat{u}_{I_1}^{(m)}, \ldots, \hat{u}_{I_{s-1}}^{(m)}, C_{J_s})$. Thus, the (m, s)th splitting probability distribution $Q_s^{(m)}$ can be readily obtained from the (m, s)th metric $\gamma_s^{(m)}$ by exponentiation. If the (m, s)th metric $\gamma_s^{(m)}$ uses some approximations, the (m, s)th splitting probability distribution $Q_s^{(m)}$ will also be approximate.

The first embodiment comprises a team size variable $L_s^{(m)}$ for each $m \in [1, M]$ and $s \in [0, S]$, where $L_s^{(m)}$ equals the size of the (m, s)th team $T_s^{(m)}$. For s=0, by definition, $L_0^{(m)}=M$.

The first embodiment also comprises an (m, s−1)th rank variable $p_{s-1}^{(m)}$ for each $m \in [1, M]$ and $s \in [1, S]$, where $p_{s-1}^{(m)}$ is a rank of the CPD index m in the (m, s−1)th team $T_{s-1}^{(m)}$ when the CPD indexes in the team $T_{s-1}^{(m)}$ are listed in ascending numerical order. For example, if m=5 and $T_{s-1}^{(m)}=\{3, 4, 5, 6\}$, then $p_{s-1}^{(m)}=3$ since m=5 is the third smallest element in the set $\{3, 4, 5, 6\}$.

In the first embodiment, the (m, s−1)th position variable is $q_{s-1}^{(m)}$ is defined in terms of the (m, s−1)th rank variable $p_{s-1}^{(m)}$ by the relation $q_{s-1}^{(m)} = p_{s-1}^{(m)} - \frac{1}{2}$.

Total order relation. In various embodiments of the present principles (such as the first embodiment here), the PPDs 410 are equipped with a total order relation, where the total order relation is defined on pairs of vectors of a common length over the polar transform alphabet. Recall that a total order "<" on a domain is a binary relation such that for any two distinct elements v, v' in the domain, we have either v<v' or v'<v. We say that v is smaller than v' if v<v' holds. We say that v is smaller than or equal to v' and write v≤v' if v<v' or v=v' holds. We say that v is the smallest element in a subset D of the domain if v∈D and v<v' for every v'∈D\{v}.

Although the present principles can be used with any total order relation, for illustrative purposes only, we will assume that the polar transform alphabet in the first embodiment is $\mathbb{F}_q$, the finite field with q elements, where q is some fixed prime power. We will define the total order on vectors by associating to each vector $v=(v_1, \ldots, v_k)$ over $\mathbb{F}_q$ the integer $$\sum_{i=1}^{k} v_i q^{k-i},$$

and using the ordinary order relation on the set of integers to rank any distinct pair of vectors of a common length. In other words, for any two distinct vectors $p=(v_1, \ldots, v_k)$ and $v'=(v'_1, \ldots, v'_k)$ of a common length k, we will write v<v' if the inequality $$\sum_{i=1}^{k} v_i q^{k-i} < \sum_{i=1}^{k} v'_i q^{k-i}$$

is satisfied.

The mth CPD 410-m begins the first step of decoding with the initial values $T_0^{(m)}=T(\emptyset)=[1, M]$, $L_0^{(m)}=M$, $p_0^{(m)}=m$, and $q_0^{(m)}=p_0^{(m)}-\frac{1}{2}=m-\frac{1}{2}$. In the first step of decoding, the mth CPD 410-m calculates the (m, 1)th metric $\gamma_1^{(m)}$ and the (m, 1)th splitting distribution $Q_1^{(m)}$ and sets the (m, 1)th segment $\hat{u}_{I_1}^{(m)}$ to the smallest value of $v_{I_1}$ among vectors of length $|I_1|$ over $\mathbb{F}_q$ for which $q_1^{(m)} \leq L_0^{(m)}]F(v_{I_1}|y)$, where $F(\cdot|y)$ is the cumulative distribution function (CDF) of $Q_1^{(m)}$, i.e., $F(v_{I_1}|y)=\Sigma \tilde{v}_{I_1} \leq v_{I_1} Q_1^{(m)}(v_{I_1})$ where the sum is over all $\tilde{v}_{I_1}$ that are smaller than or equal to $v_{I_1}$ according to the total order on vectors of length $|I_1|$ over $\mathbb{F}_q$.

It is important to note here that the mth CPD 410-m is able to identify its teammates in $T(\hat{u}_{I_1}^{(m)})$ according to this decision rule. Consequently, the mth CPD 410-m is also able to calculate the (m, 1)th size variable $L_1^{(m)}$ by setting it equal to the size of $T(\hat{u}_{I_1}^{(m)})$ and the (m, 1)th rank variable $p_1^{(m)}$ as the rank of the CPD index m within $T(\hat{u}_{I_1}^{(m)})$. The ability to calculate the (m, 1)th size variable $L_1^{(m)}$ and the (m, 1)th rank variable $p_1^{(m)}$ forms the basis of an inductive argument for establishing that the first embodiment is a logically consistent and computationally feasible sequential decoding procedure.

In general, for any $s \in [1, S]$, the mth CPD 410-m begins the sth step of decoding with the past decisions $\hat{u}_{I_1}^{(m)}, \ldots, \hat{u}_{I_{s-1}}^{(m)}$, the (m, s−1)th size variable $L_{s-1}^{(m)}$, and the (m, s−1)th rank variable $p_{s-1}^{(m)}$ already available in its memory. In the sth step of decoding, the mth CPD sets the (m, s)th position variable to $q_{s-1}^{(m)}=p_{s-1}^{(m)}-\frac{1}{2}$, calculates the (m, s)th metric $\gamma_s^{(m)}$ and the (m, s)th splitting distribution $Q_s^{(m)}$ and sets the (m, s)th segment $\hat{u}_{I_s}^{(m)}$ to the smallest value of $v_{I_s}$ with respect to the total order relation on the set of all possible values of the (m, s)th segment $\hat{u}_{I_s}^{(m)}$, such that the inequality $q_{s-1}^{(m)} \leq L_{s-1}^{(m)} \cdot F(v_{I_s}|y, \hat{u}_{I_{s-1}}^{(m)})$ is satisfied, where $F(\cdot|y, \hat{u}_{I_1}^{(m)}, \ldots, \hat{u}_{I_{s-1}}^{(m)})$ is the CDF of $Q_s^{(m)}$, i.e., $F(v_{I_s}|y, \hat{u}_{I_1}^{(m)}, \ldots, \hat{u}_{I_{s-1}}^{(m)})$ equals the sum $\Sigma \tilde{v}_{I_s} \leq v_{I_s} P(v_{I_s}|y, \hat{u}_{I_1}^{(m)}, \ldots, \hat{u}_{I_{s-1}}^{(m)}, C_{J_s})$, where the sum is over all $\tilde{v}_{I_s}$ that are smaller than or equal to $v_{I_s}$ according to the total order relation.

This completes the description of the specific aspects of the first embodiment of the present principles. The unspecified steps in the first embodiment follow the generic procedures described above in connection with FIG. 4.

Comparison with RSC decoding. At a high-level, the present principles are based on a derandomization of the random successive cancellation (RSC) decoding method mentioned above.

The person skilled in the art of source and channel coding schemes will recognize that the first embodiment above is a channel coding version of the Shannon-Fano-Elias source coding method. If the PPDs 410 were to employ RSC decoding, then the mth CPD 410-m would choose the (m, s)th segment $\hat{u}_{I_s}^{(m)}$ at random from the sth CC-APP $P(\hat{u}_{I_s}^{(m)}|y, \hat{u}_{I_1}^{(m)}, \ldots, \hat{u}_{I_{s-1}}^{(m)}, C_{J_s})$. Clearly, RSC decoding offers a convenient method of producing a diversity of decisions by the PPDs 410 without requiring any coordination or communication overhead among them. Furthermore, it is not difficult to prove that RSC decoding is capable of achieving the Shannon limits in channel coding. Despite its conceptual simplicity, RSC decoding has some practical drawbacks. First, there is a risk that some of the CPDs in RSC decoding produce duplicate decisions, resulting in a loss in diversity. Second, RSC decoding requires independent random number generators at the CPDs, which adds to the complexity of implementation. The present principles avoid these difficulties by using a derandomized version of RSC decoding, as exemplified by the first embodiment above.

Figure 5A:
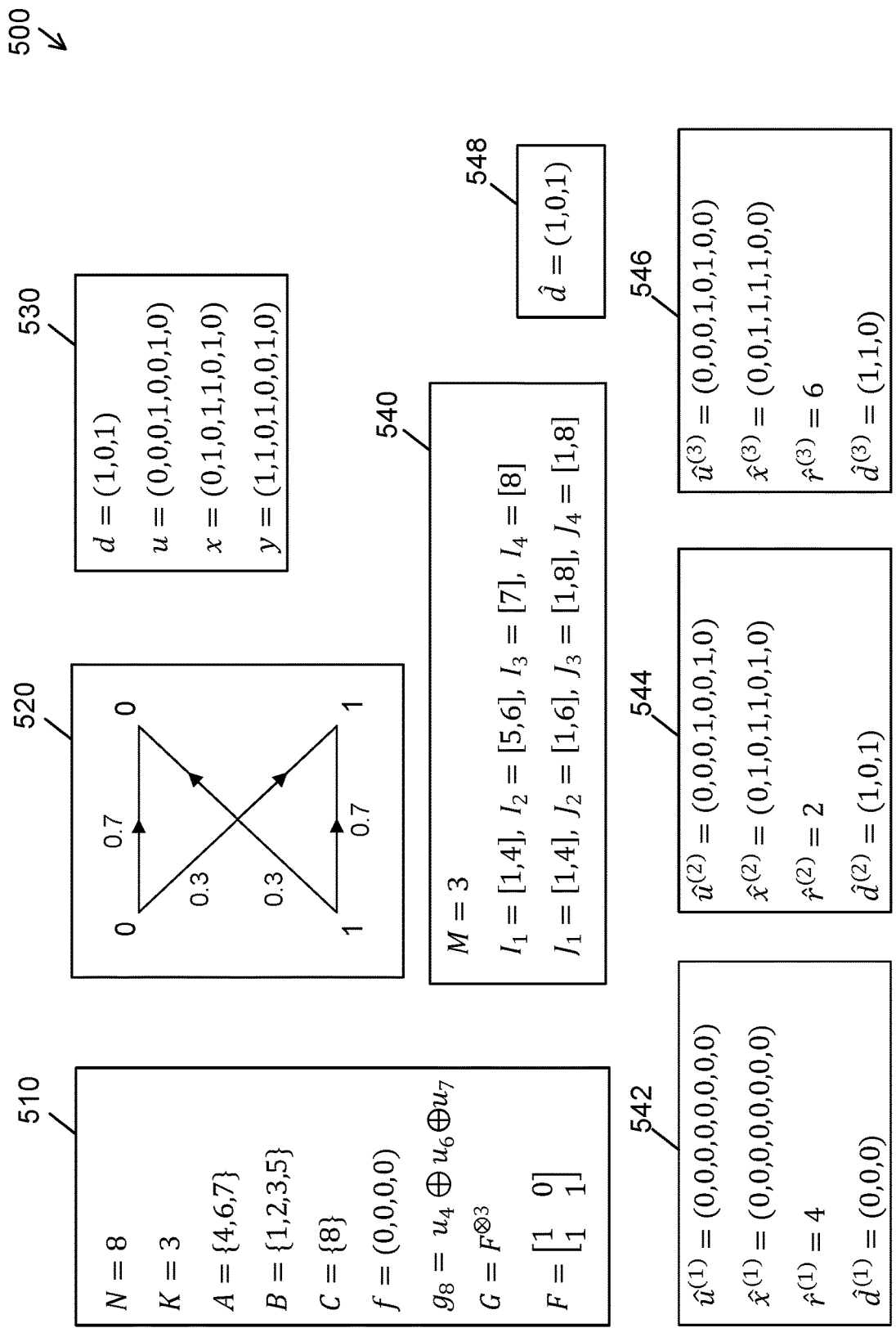
FIGS. 5A and 5B illustrate an example of a first embodiment of a team polar decoder in accordance with certain aspects of the present disclosure.
Figure 5B:
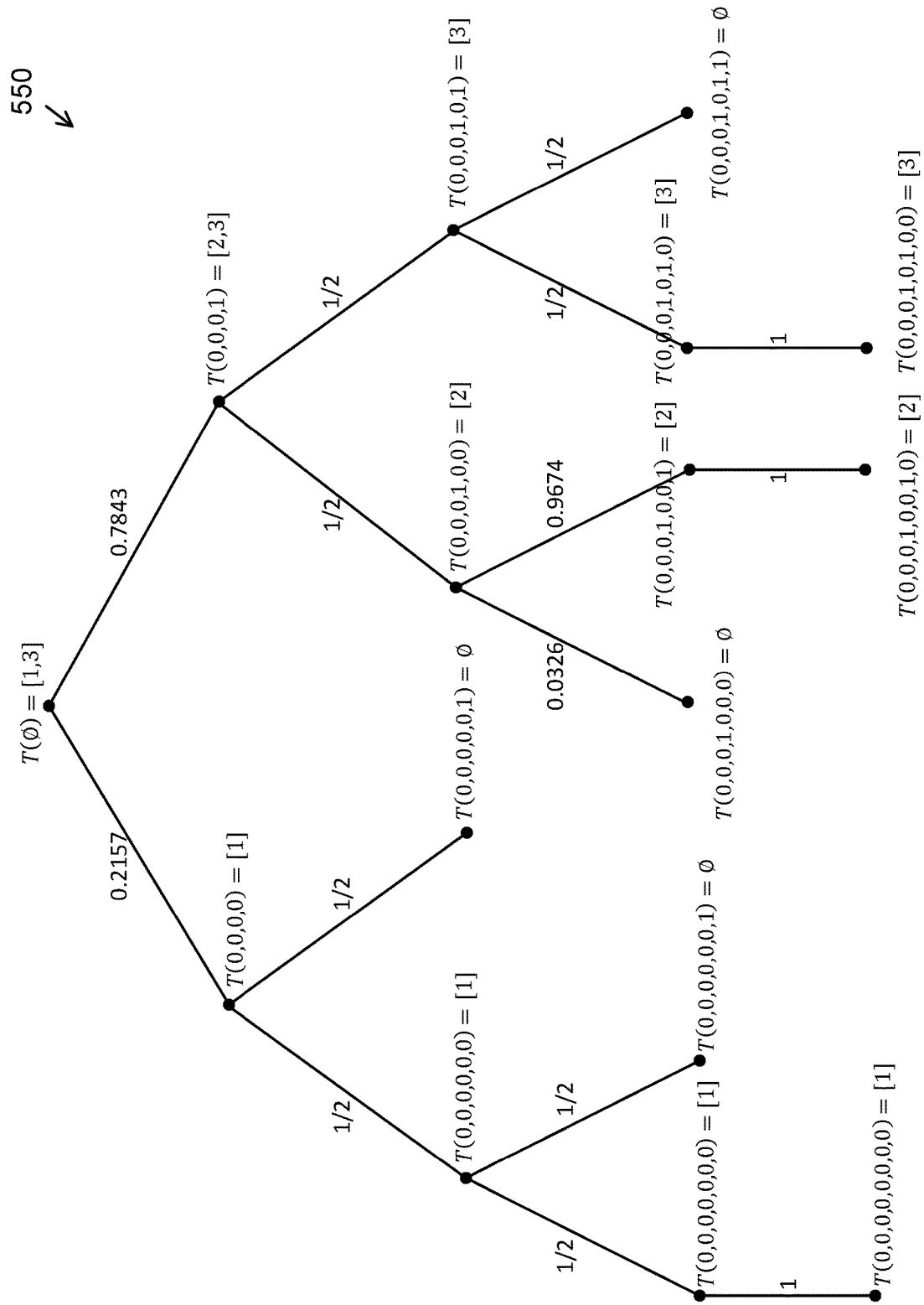

Next, we turn to FIGS. 5A and 5B to discuss an example 500 of the first embodiment of the present principles. Exhibit 510 displays the parameters (N, K, A, B, C, f, g, G) of the polar code used in the example 500. The code is over the binary field $\mathbb{F}_2$ and has code length N=8, dimension K=3, data index set A={4, 6, 7}, frozen index set B={1, 2, 3, 5}, and parity-check index set C={8}. The FB is f=(0, 0, 0, 0), and the PCB is defined as $u_8=g_8(u_1, \ldots, u_7)=u_4 \oplus u_6 \oplus u_7$, where $\oplus$ denotes addition in $\mathbb{F}_2$. The polar transform matrix is the standard polar transform with $G=F^{\oplus 3}$ with $$F = \begin{bmatrix} 1 & 0 \\ 1 & 1 \end{bmatrix}.$$

The channel 330 in the example 500 is a binary symmetric channel (BSC), as shown in exhibit 520, with channel input and output alphabets {0, 1} and channel transition probabilities W(0|0)=W(1|1)=0.7 and W(1|0)=W(0|1)=0.3. The BSC 520 inverts its input and causes a bit error with probability 0.3.

Exhibit 530 displays the encoding and channel transmission operations in the example 500. The TIB u=(0, 0, 0, 1, 0, 0, 1, 0) is obtained by the data mapping $u_A$=d=(1, 0, 1), the frozen part mapping $u_B$=f=(0, 0, 0, 0), and the parity-check calculation $u_8=u_4 \oplus u_6 \oplus u_7=0$. The CB x=(0, 1, 0, 1, 1, 0, 1, 0) is obtained by the polar transform x=uG. Exhibit 530 displays the NCB y=(1, 1, 0, 1, 0, 0, 1, 0) received at the channel output when the CB is transmitted over the BSC 520. The NCB y contains two errors (in positions 1 and 5) introduced by the channel.

Exhibit 540 specifies the parameters of the TPD 340 in the example 500. The TPD 340 comprises M=3 CPDs. Decoding is carried out in the natural index order in accordance with the partition $I_1$=[1,4], $I_2$=[5,6], $I_3$=[7], $I_4$=[8], and the constraint windows $J_1$=[1,4], $J_2$=[1,6], $J_3$=[1,8], $J_4$=[1,8]. We note that the CPCF $g_8$ is a causal CPCF under the natural decoding order.

The tree diagram 550 shows a decoding tree that displays the evolution of the teams in the example 500. For each $m \in [1,3]$, the mth CPD 410-m starts its decoding operation with $T_0^{(m)}=T(\emptyset)=[1,3]$, $L_0^{(m)}=3$, $p_0^{(m)}=m$, and $q_0^{(m)}=m-\frac{1}{2}$. In the (s=1)th step, the mth CPD 410-m calculates the (m, s=1)th CC-APP $P(v_{I_1}|y, C_{J_1})$, where the (s=1)th set of constraints $C_{J_1}$ consists of $(U_1, U_2, U_3)=(0,0,0)$, arising from the frozen symbols within the (s=1)th constraint window $J_1$=[1,4]. Using prior-art SC decoding methods, the probability $P(v_{I_1}|y, C_{J_1})$ is calculated as 0.2157 for $v_{I_1}$=(0, 0, 0, 0) and 0.7843 for $v_{I_1}$=(0, 0, 0, 1). The mth CPD selects $\hat{u}_{I_1}^{(m)}$ as the smallest value of $v_{I_1}$ such that $q_0^{(m)} < M \cdot F(v_{I_1}|y, C_{J_1})$. Here, $M \cdot F(v_{I_1}|y, C_{J_1})$ equals 0.6471 for $v_{I_1}$=(0, 0, 0, 0) and 3.000 for $v_{I_1}$=(0, 0, 0, 1). So, at the end of the (s=1)th step, we have T(0, 0, 0, 0)=[1] and T(0, 0, 0, 1)=[2, 3]. These teams are shown at level 1 of the tree diagram 550. The CPDs update their parameters as follows. $T_1^{(1)}$=[1], $T_1^{(2)}=T_1^{(3)}$=[2,3], $L_1^{(1)}$=1, $L_1^{(2)}=L_1^{(3)}$=2, $p_1^{(2)}$=1, $p_1^{(2)}$=1, $p_1^{(3)}$=2, $q_1^{(1)}=\frac{1}{2}$, $q_1^{(2)}=\frac{1}{2}$, and $=q_1^{(3)}$=3/2.

It is worth noting that, if the CPDs in the example 500 were to apply RSC decoding, the mth CPD would choose to join the teams T(0, 0, 0, 0) and T(0, 0, 0, 1) with probabilities 0.2157 and 0.7843, respectively, independently of the other CPDs. Then, there would be a probability (0.7843)3=0.4824 that all three of the CPDs join the team T(0, 0, 0, 1). Derandomization in accordance with the first embodiment of the present principles provides a deterministic procedure for splitting the initial team T(0) into the subteams T(0, 0, 0, 0)=[1] and T(0, 0, 0, 1)=[2, 3] and reduces the uncertainty in the splitting procedure. Also, unlike RSC decoding, the first embodiment does not require that the CPDs be equipped with random number generators.

Returning to the example 500, in the (s=2)th step of decoding, the members of the team T(0, 0, 0, 0) calculate $P(v_{I_2}|y, U_{I_1}=(0, 0, 0, 0), C_2)$, while the members of T(0, 0, 0, 1) calculate $P(v_{I_2}|y, U_{I_1}=(0, 0, 0, 1), C_{J_2})$ where $C_{J_2}$ enforces the constraint $(U_1, U_2, U_3, U_5)=(0, 0, 0, 0)$.

In the present example, $P(v_{I_2}|y, U_{I_1}=(0, 0, 0, 0), C_{J_2})$ equals ½ for $v_{I_2} \in \{(0, 0), (0, 1)\}$ and 0 for $v_{I_2} \in \{(1,0), (1,1)\}$. Thus, the descendants of the team T(0, 0, 0, 0)=[1] are determined as T(0, 0, 0, 0, 0, 0)=[1] and T(0, 0, 0, 0, 0, 1)=Ø, as shown at the second level of the tree diagram 550. The team T(0, 0, 0, 0, 0, 1) is empty because the first embodiment favors smaller values when there is a tie in decision making.

In the example, $P(v_{I_2}|y, U_{I_1}=(0, 0, 0, 1), C_{J_2})$ equals ½ for $v_{I_2} \in \{(0, 0), (0, 1)\}$ and 0 for $v_{I_2} \in \{(1,0), (1,1)\}$. Thus, the descendants of the team T(0, 0, 0, 1) are determined as T(0, 0, 0, 1, 0, 0)=[2] and T(0, 0, 0, 0, 1, 1)=[3]. Here, the present principles split the team T(0, 0, 0, 1) evenly as there are two CPDs in T(0, 0, 0, 1) and two equally likely follow-up decisions for the (s=2)th segment $U_{I_2}$ of the TIB random variable U.

At the end of the (s=2)th step of decoding, the CPDs update their parameters as follows. $T_2^{(1)}=[1]$, $T_2^{(2)}=[2]$, $T_2^{(3)}=[3]$, $L_2^{(1)}=L_2^{(2)}=L_2^{3}=1$, $p_2^{(1)}=p_2^{(2)}=p_2^{3}=1$, and $q_2^{(1)}=q_2^{(2)}=q_2^{3}=\frac{1}{2}$.

The person skilled in the art will have no difficulty in verifying the rest of the decoding calculations in the example 500. At the end of decoding, the CPDs produce the DTIBs $\hat{u}^{(1)}$, $\hat{u}_2^{(1)}$, and $\hat{u}^{(3)}$ as shown in exhibits 542, 544, and 546, respectively. The mth CPD produces the mth CDDB $\hat{d}^{(m)}$ from the mth DTIB $\hat{u}^{(m)}$ by the data-demapping operation $\hat{d}^{(m)} = \hat{u}_A^{(m)}$. The mth CPD also produces the mth RI $r^{(m)}$ by re-encoding the mth DTIB $\hat{u}^{(m)}$ into an mth DCB $\hat{x}^{(m)} = \hat{u}^{(m)} G$, and setting $r^{(m)}$ equal to the Hamming distance between the NCB y and the mth DCB $\hat{x}^{(m)}$. Here, smaller values of the Hamming distance indicate a more reliable decision. Accordingly, as shown in exhibit 548, the TDM 320 selects the (m=2)th CDDB $\hat{d}_2^{(2)}=(1, 0, 1)$ as the DDB $\hat{d}$. Thus, the TPD 340 succeeds in recovering the DB d=(1, 0, 1) without any errors in the present example. This completes the discussion of the example 500.

Figure 6A:
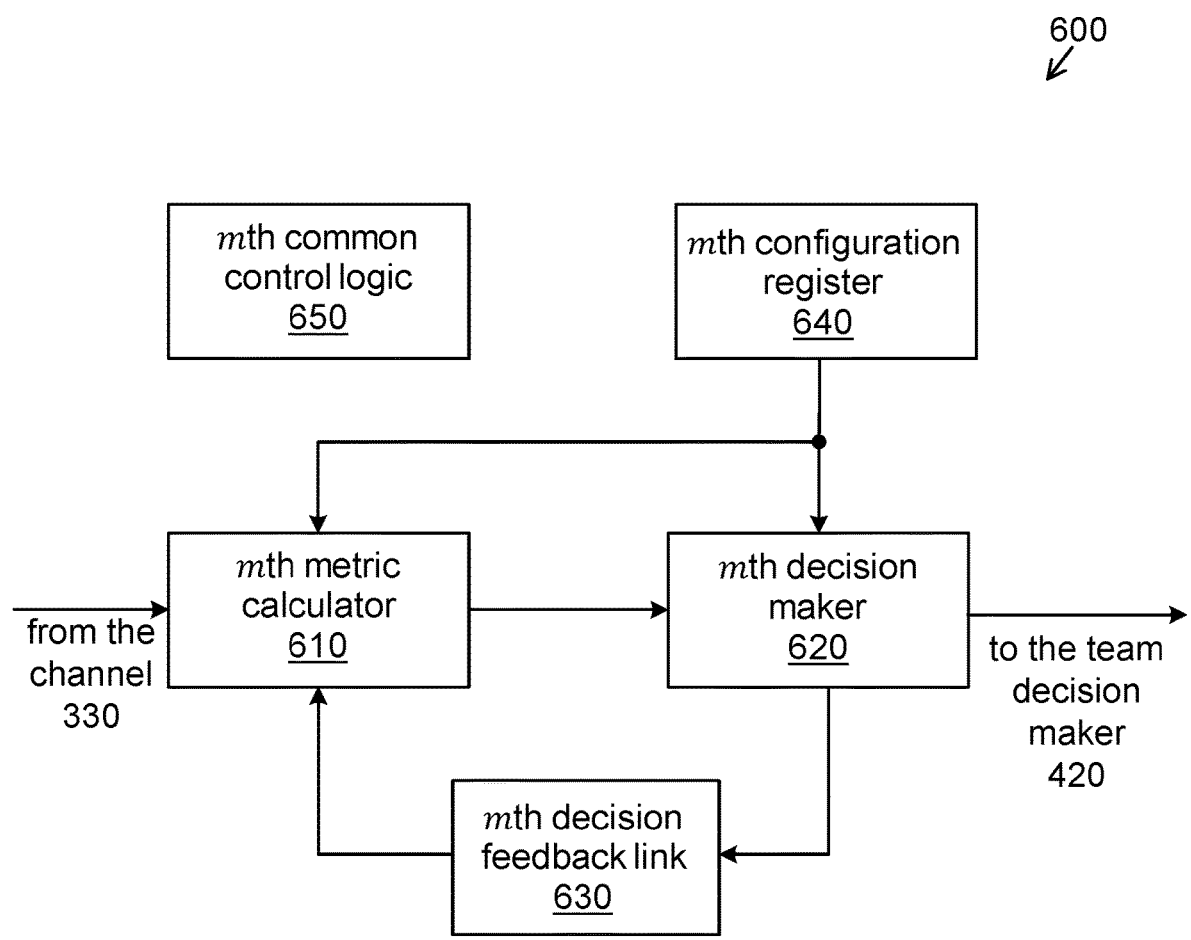
FIG. 6A is a block diagram illustrating a hardware implementation of a team polar decoder in accordance with certain aspects of the present disclosure.

FIG. 6A is a functional block diagram illustrating a hardware implementation architecture 600 of the mth CPD 410-m in accordance with the present principles. The architecture 600 comprises an mth metric calculator (MC) 610, an mth decision maker (DM) 620, an mth decision feedback link (DFL) 630, an mth configuration register (CR) 640, and an mth common control logic (CCL) 650. The architecture 600 has the same form as a typical SC decoder architecture except that the architecture 600 can be configured to implement more general decision rules in accordance with the present principles.

The mth CCL 650 takes care of common control functions such as keeping track of which step of decoding is being executed, ensuring timely activation and deactivation of modules (the MC 610 and the DM 620 in particular), and controlling the input/output interfaces.

The mth CR 640 comprises registers that hold configuration parameters for implementing the metric calculation and decision making steps of the mth CPD 410-m, including the polar code parameters, such as (N, K, A, B, C, f, g, G), the partition $(I_1, I_2, \ldots, I_S)$, and the constraint windows $(J_1, J_2, \ldots, J_S)$.

The architecture 600 affords a memory-efficient implementation of the first embodiment in which the mth CPD 410-m comprises a step counter registers for keeping track of which step the decoder is executing, a team size register L for keeping track of the (m, s−1)th team size variable $L_{s-1}^{(m)}$, a rank register p for keeping track of the (m, s)th rank variable $p_s^{(m)}$, and a position register q for keeping track of the (m, s)th position variable $q_s^{(m)}$. These registers are initialized as $L=L_0^{(m)}=M$, $p=p_0^{(m)}=m$, $q=q_0^{(m)}=m-\frac{1}{2}$, and s=1.

A new round of decoding by the mth CPD 410-m begins with the mth MC 610 receiving the NCB y from the channel 330. For each $s \in [1, S]$, in the sth step of decoding, the mth MC 610 generates an (m, s)th metric $\gamma_s^{(m)}$, the mth DM 620 receives the (m, s)th metric $\gamma_s^{(m)}$ and produces an (m, s)th segment $\hat{u}_{I_s}^{(m)}$ in accordance with the present principles, and the mth DFL 630 carries the (m, s)th segment $\hat{u}_{I_s}^{(m)}$ to the mth MC 610. For each $1 \le s < S$, the sth round of decoding is completed by setting register L to the size of the (m, s)th team $T_s^{(m)}$, register p to the rank of the CPD index m in the (m, s)th team $T_s^{(m)}$, register q to p−½, and incrementing the step counter register from s to s+1. At the end of the Sth step, the mth DM 620 further produces the mth CDDB $d^{(m)}$ and the mth RI $r^{(m)}$, and sends the mth CDDB $d^{(m)}$ and the mth RI $r^{(m)}$ to the TDM 420.

The person skilled in the art of digital design will recognize that the architecture 600 described above can be implemented on a wide range of electronic platforms, including general or special purpose processors, FPGAs, and ASICs. The DFL 640 can be implemented as an on-board communication link or bus; alternatively, the DFL 640 may be a random access memory (RAM) which is written into by the DM 620 and read out by the MC 610.

Figure 6B:
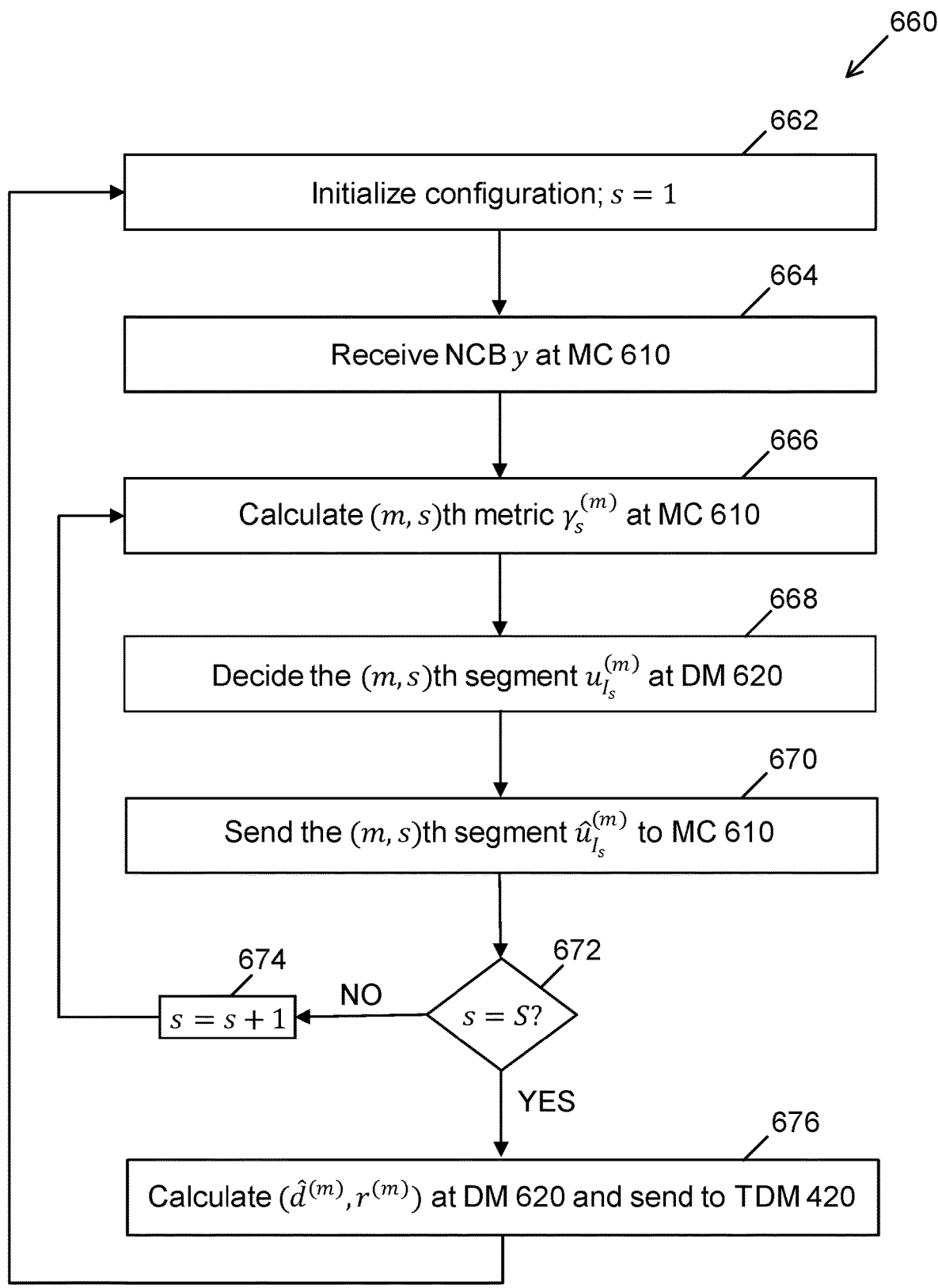
FIG. 6B is a flowchart illustrating decoding steps of a team polar decoder in accordance with certain aspects of the present disclosure.

FIG. 6B is a flowchart 660 illustrating the sequential nature of the decoding operations carried out by the mth CPD 410-m in the architecture 600. All transitions between modules in the flowchart 660 are supervised by the mth CCL 650.

In module 662, the mth CPD 410-m initializes its configuration and sets the step counter to its initial value of s=1. In module 664, the mth MC 610 receives the NCB y from the channel 330 and a new round of decoding begins. In module 666, the mth MC 610 calculates the (m, s)th metric $\gamma_s^{(m)}$. In module 668, the mth DM 620 decides the (m, s)th segment $\hat{u}_{I_s}^{(m)}$. In module 670, the mth DM 620 sends the (m, s)th segment $\hat{u}_{I_s}^{(m)}$ to the mth MC 610 via the mth DFL 630. In module 672, the CCL 650 checks if the value s of the step counter has reached its final value S. If s<S, then the step counter is incremented by one in module 674 and control is passed back to module 666, initiating the next step of decoding. If s=S, then control is passed to module 676 where the mth DM 620 calculates the mth DDR $d^{(m)}$ and the mth RI $r^{(m)}$, and sends them to the TDM 420. Upon completion of the task in module 676, the CCL 650 passes control to module 662, and initiates a new round of decoding. This completes the description of the flowchart 660.

A second embodiment of the present principles. The second embodiment differs from the first embodiment primarily by allowing the (m, s)th splitting distribution $Q_s^{(m)}$ to depend on the (m, s)th metric $\gamma_s^{(m)}$ and by having the sth step of decoding to comprise an (s−1)th dimension $K_{s-1}$. For each $s \in [1, S]$, where the (s−1)th dimension $K_{s-1}$ is defined as the number of data bits that remain to be decided in steps s through S. If the polar code under consideration has a data index set A and the decoder uses a partition $(I_1, I_2, \ldots, I_S)$, then the (s−1)th dimension $K_{s-1}$ has an initial value $K_0=|A|$ and satisfies the relation $K_s=K_{s-1}-|A \cap I_s|$ for $s \in [1, S]$. Thus, the (s−1)th dimension $K_{s-1}$ is independent of the CPD index m. The second embodiment differs from the first embodiment also by allowing the (m, s)th position variable $q_s^{(m)}$ to depend on the (m, s)th splitting distribution $Q_s^{(m)}$.

To specify the second embodiment formally, we only need to specify the modules 662 and 668 of FIG. 6B since the other modules are the same as in the first embodiment. We will describe the implementation of these two modules using a specific example of the second example. The person skilled in the art will have no difficulty in generalizing the example.

Figure 7:
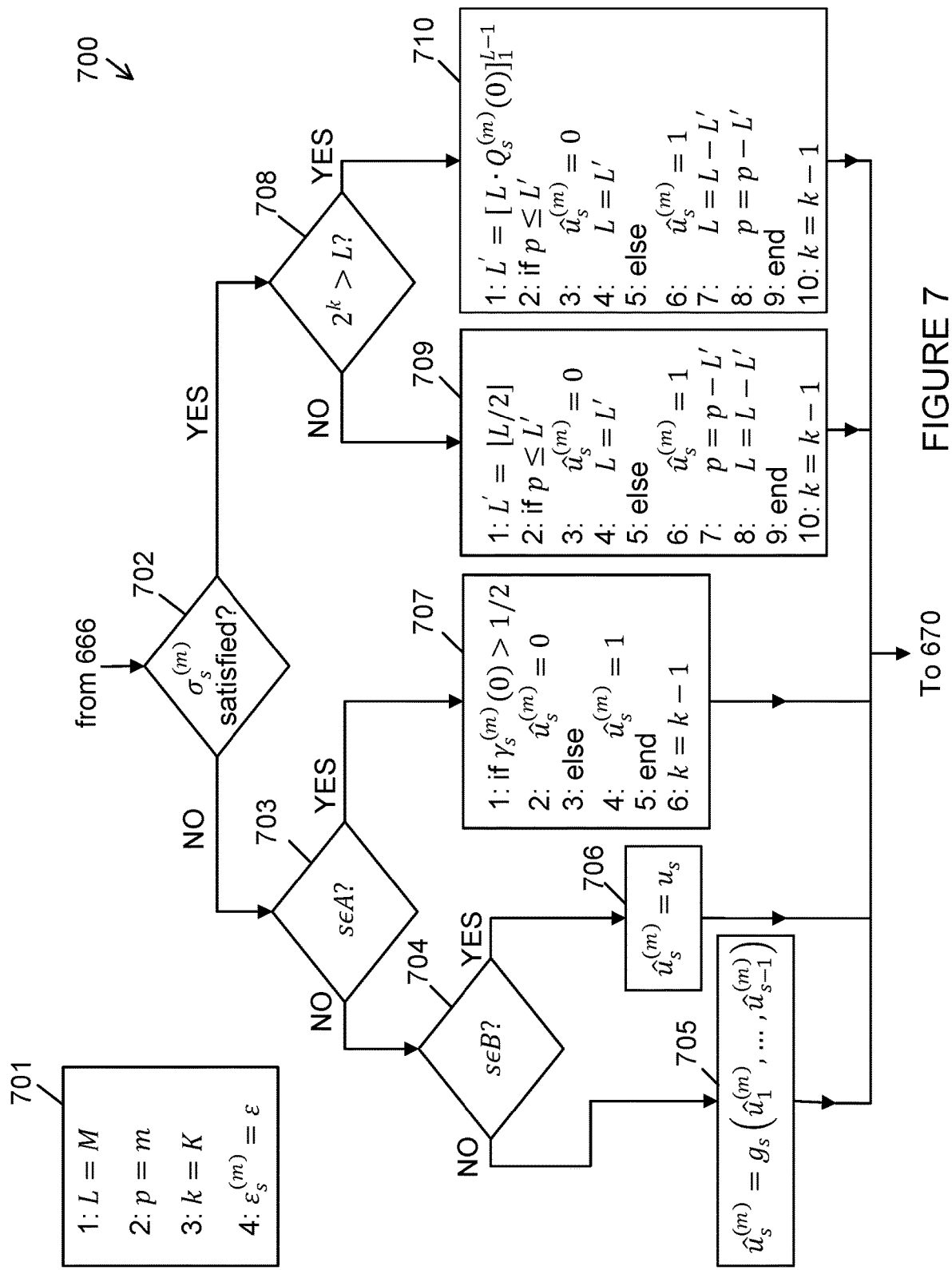
FIG. 7 illustrates initialization and decision making steps in an example of a second embodiment of a team polar decoder in accordance with certain aspects of the present disclosure.

FIG. 7 is a flowchart 700 showing details of the modules 662 and 668 of FIG. 6B in an example of the second embodiment of the present principles. The polar code in the example is assumed to be a code over $\mathbb{F}_2$ with parameters (N, K, A, B, C, f, g, G), where $G = F^{\otimes n}$ with $$F = \begin{bmatrix} 1 & 0 \\ 1 & 1 \end{bmatrix}$$

and g comprises CPCFs $\{g_i : i \in C\}$ that are causal with respect to the natural decoding order. The other parameters in the set (N, K, A, B, C, f, g, G) may be arbitrary.

The present example assumes that each CPD in the PPDs 410 carries out decoding in the natural index order and is configured in accordance with a partition $(I_1, I_2, \ldots, I_S)$ and constraint windows $(J_1, J_2, \ldots, J_S)$, where S=N, $I_s=\{s\}$, and $J_s=[1, s]$ for each $s \in [1, N]$. Since the segments $u_{I_s}$ are one-dimensional, we will refer to them as symbols in the following discussion of FIG. 7.

For simplicity, we assume that in the present example the (m, s)th metric $\gamma_s^{(m)}$ equals the APP $P(\cdot|y, \hat{u}_1^{(m)}, \ldots, \hat{u}_{s-1}^{(m)})$. In other words, we assume that $\gamma_s^{(m)}$ is a probability distribution with $\gamma_s^{(m)}(v_s) = P(v_s|y, \hat{u}_1^{(m)}, \ldots, \hat{u}_{s-1}^{(m)})$ for $v_s \in \mathbb{F}_2$.

Module 701 of the flowchart 700 corresponds to module 662 of the flowchart 660 and comprises the initialization of the team size register L to M and the rank register p to m as in the first embodiment. Module 701 also comprises the initialization of a dimension register k which keeps track of the (s−1)th dimension $K_{s-1}$. In the present example, we have $K_{s-1} = |A \cap [s, N]|$ and $K_s = K_{s-1} - 1$ or $K_s = K_{s-1}$ depending on whether s belongs to the data index set A or not, respectively. The dimension register k is initialized to the code dimension K in line 3 of module 701. As in the first embodiment, at the start of the sth step of decoding, the team size register L and the rank register p contain the values of the (m, s−1)th team size variable $L_{s-1}^{(m)}$ and the (m, s−1)th rank variable $p_{s-1}^{(m)}$. Here, we do not need an explicit position register q for holding the value of the (m, s−1)th position variable $q_{s-1}^{(m)}$.

Module 701 further comprises the initialization of an (m, s)th sensitivity parameter $\varepsilon_s^{(m)}$ for each $m \in [1, M]$ and $s \in A$. In general, $\varepsilon_s^{(m)}$ a real number between 0 and 1, and signifies the risk of deciding the (m, s)th symbol $u_s^{(m)}$ in error if the (m, s−1)th team $T_{s-1}^{(m)}$ is not split in the sth step of decoding. In the present example of the second embodiment, $\varepsilon_s^{(m)}$ set to a constant value e for each $m \in [1, M]$ and $s \in A$; however, in general, $\varepsilon_s^{(m)}$ may depend on m and s, as long as members of the (m, s−1)th team $T_{s-1}^{(m)}$ are able to calculate the same $\varepsilon_s^{(m)}$ value based on their common decoding history until the sth step of decoding.

Modules 702 through 710 correspond to an embodiment of module 668. An (m, s)th splitting test $\sigma_s^{(m)}$ is carried out in module 702. The (m, s)th splitting test $\sigma_s^{(m)}$ is satisfied if a first condition and a second condition are satisfied, where the first condition is satisfied if $(s \in A)$ and $(L_{s-1}^{(m)} > 1)$ are both satisfied, and the second condition is satisfied if either $(L_{s-1}^{(m)} \geq 2^k)$ or $(\varepsilon_s^{(m)} < \gamma_s^{(m)}(0) < 1 - \varepsilon_s^{(m)})$ is satisfied. Here, the second condition is checked only if the first condition is satisfied; so, the sensitivity parameter $\varepsilon_s^{(m)}$ need not be defined for $s \notin A$. The condition $(s \in A)$ signifies that the current symbol $\hat{u}_s^{(m)}$ that will be decided is a data symbol. The condition $(L_{s-1}^{(m)} > 1)$ signifies that the (m, s−1)th team $T_{s-1}^{(m)}$ contains at least two CPDs and so it is possible to split the (m, s−1)th team $T_{s-1}^{(m)}$ into two teams. (The value of the (m, s)th team size variable $L_{s-1}^{(m)}$ that is needed in this test is contained in the team size register L.) The condition $(L_{s-1}^{(m)} \geq 2')$ signifies that the size of the (m, s−1)th team $T_{s-1}^{(m)}$ is greater than or equal to the number of possible extensions $(\hat{u}_s^{(m)}, \hat{u}_{s+1}^{(m)}, \ldots, \hat{u}_N^{(m)})$ of the current decoding path $(\hat{u}_1^{(m)}, \hat{u}_2^{(m)}, \ldots, \hat{u}_{s-1}^{(m)})$, where only the extensions that are feasible under the polar code constraints are counted. The condition $(\varepsilon_s^{(m)} < \gamma_s^{(m)}(0) < 1 - \varepsilon_s^{(m)})$ signifies that the metric $\gamma_s^{(m)}$ does not indicate a sufficiently reliable decision for the current symbol $\hat{u}_s^{(m)}$ that will be decided, and enforces splitting of the current team. Note that $\varepsilon_s^{(m)} < \gamma_s^{(m)}(0) < 1 - \varepsilon_s^{(m)}$ implies the symmetric condition $\varepsilon_s^{(m)} < \gamma_s^{(m)}(1) < 1 - \varepsilon_s^{(m)}$ since we have a binary alphabet here.

Modules 703 through 707 take effect only if the (m, s)th splitting test $\sigma_s^{(m)}$ fails and they correspond to an embodiment of a regular decision rule as in ordinary SC decoding. Module 703 checks if s belongs to the data index set A. Module 704 checks if s belongs to the frozen index set B. If the checks in modules 703 and 704 both fail, then s belongs to the parity-check index set C and, in that case, the mth DM 620 calculates the value of $\hat{u}_s^{(m)}$ by using the parity-check function $g_s$ and sets $\overline{u}_s^{(m)} = g_s(\hat{u}_1^{(m)}, \hat{u}_2^{(m)}, \ldots, \hat{u}_{s-1}^{(m)})$, as shown module 705. If the check in module 704 succeeds, then s belongs to the frozen index set B and the mth DM 620 sets $\hat{u}_s^{(m)}$ to the frozen value $u_s$, as shown in module 706. If the check in module 703 succeeds, then s belongs to the data index set A; in that case, the mth DM 620 calculates $\hat{u}_s^{(m)}$ by the script in module 707, which sets $\hat{u}_s^{(m)}$ equal to 0 or 1 depending on which value is the more probable value of $\hat{u}_s^{(m)}$ as measured by the (m, s)th metric $\gamma_s^{(m)}$. In line 6 of module 707, the dimension register k is decremented by 1 to account for the fact that the symbol $\hat{u}_s^{(m)}$ that was decided is a data symbol. The team size register L and the rank register p remain unchanged after executing module 705, 706, or 707 since there is no splitting of the (m, s−1)th team, i.e., $T_s^{(m)} = T_{s-1}^{(m)}$.

Modules 708 through 710 correspond to a splitting decision rule that splits the (m, s−1)th team $T_{s-1}^{(m)}$ into two parts. If the check in module 702 succeeds, then the mth DM 620 carries out a check in module 708 to see if $2^k > L_{s-1}^{(m)}$.

If the test in module 708 fails, then $2^k \leq L_{s-1}^{(m)}$ and the size of the (m, s−1)th team $T_{s-1}^{(m)}$ is large enough to explore all possible extensions $(\hat{u}_s^{(m)}, \hat{u}_{s+1}^{(m)}, \ldots, \hat{u}_N^{(m)})$ of the current decoding path $(\hat{u}_1^{(m)}, \hat{u}_2^{(m)}, \ldots, \hat{u}_{s-1}^{(m)})$. In that case, the mth DM 620 moves to module 709 and applies splitting with the (m, s)th splitting distribution $Q_s^{(m)}$ set to the uniform distribution, i.e., $Q_s^{(m)}(0) = Q_s^{(m)}(1) = \frac{1}{2}$. Line 1 of module 709 sets a temporary variable L' equal to $\lfloor L/2 \rfloor$, where the notation $\lfloor \cdot \rfloor$ denotes the floor function. (For any real number r, the floor function $\lfloor r \rfloor$ equals the largest integer that is smaller than or equal to r.) Thus, the script in module 709 ensures that the team $T_{s-1}^{(m)}$ is divided as evenly as possible subject to integer constraints on the team sizes. According to lines 1 through 8 of the script in module 709, if $L_{s-1}^{(m)}$ is an even number, one has $L_s^{(m)} = L_{s-1}^{(m)}/2$ regardless of how the (m, s)th symbol $\hat{u}_s^{(m)}$ is decided; on the other hand, if $L_{s-1}^{(m)}$ is an odd number, one has $L_{s-1}^{(m)}$ equal to $(L_{s-1}^{(m)} - 1)/2$ or $(L_{s-1}^{(m)} + 1)/2$ depending on whether the (m, s)th symbol $\hat{u}^{(m)}$ is decided as 0 or 1, respectively. We note that if $\hat{u}_s^{(m)}$ is decided as 0, there is no need to update the rank register p since the rank variables satisfy $p_s^{(m)}=p_{s-1}^{(m)}$; on the other hand, if $\hat{u}_s^{(m)}$ is decided as 1, then p is updated as p−L' since the rank variables now satisfy $p_s^{(m)}=p_{s-1}^{(m)}-L'$. Line 10 of module 709 decrements the dimension variable k by one on account of the fact that the symbol $u_s^{(m)}$ is a data symbol.

If the test in module 708 succeeds, then $2^k > L_{s-1}^{(m)}$ and the size of the (m, s−1)th team $T_{s-1}^{(m)}$ is not large enough to explore all possible extensions $(\bar{u}_s^{(m)}, \hat{u}_{s+1}^{(m)}, \ldots, \hat{u}_N^{(m)})$ of the current decoding path $(\hat{u}_1^{(m)}, \hat{u}_2^{(m)}, \ldots, \hat{u}_{s-1}^{(m)})$. In this case, the mth DM 620 moves to module 710 and applies splitting with the (m, s)th splitting distribution $Q_s^{(m)}$ set to the (m, s)th CC-APP $P(\cdot | y, \hat{u}_{I_1}^{(m)}, \ldots, \hat{u}_{I_{s-1}}^{(m)}, C_{J_s})$. The script in module 710 enforces a non-trivial splitting operation in the sense that $1 \leq L_s^{(m)} \leq L_{s-1}^{(m)} - 1$.

Line 1 of module 710 sets a temporary variable L' equal to $\left[ L \cdot Q_s^{(m)}(0) \right]_1^{L-1}$, where the notation $\left[ L \cdot Q_s^{(m)}(0) \right]_1^{L-1}$ denotes the integer in the set [1, L−1] that is closest to $L \cdot Q_s^{(m)}(0)$, with ties broken in favor of the smaller value. (For example, $$[5.4]_3^6 = 5, [5.5]_3^6 = 5, \text{ and } [2.3]_3^6 = 3.)$$

Line 2 of module 710 checks if the rank register p is less than or equal to L'. If p≤L', then, in line 3 of module 710, $u_s^{(m)}$ is decided as 0; and, in line 4 of module 710, L is updated as L'. If p>L', then, in line 6 of module 710, $u_s^{(m)}$ is decided as 1; in line 7 of module 710, L is updated as L−L'; and, in line 8 of module 710, p is updated as p−L'. Module 710 is completed in line 10 by decrementing the dimension variable k by one.

Following the decision in any one of the steps 705, 706, 707, 709, or 710, the mth CPD moves to module 670 of the flowchart 660 and proceeds as described in connection with FIG. 6B. This completes the description of the flowchart 700.

As illustrated by the example in FIG. 7, the main distinguishing feature of the second embodiment relative to the first embodiment is the freedom to select the (m, s)th splitting distribution $Q_s^{(m)}$ from a set of alternatives depending on various factors such as the value of the (m, s)th metric $\gamma_s^{(m)}$ and the (m, s−1)th dimension $K_{s-1}^{(m)}$. In fact, we may view the decisions in modules 705, 706, and 707 also as degenerate instances of team splitting where all team members choose their respective (m, s)th position variable $q_s^{(m)}$ in identical manner (independent of m) so as to avoid splitting the (m, s)th team TW.

Figure 8:
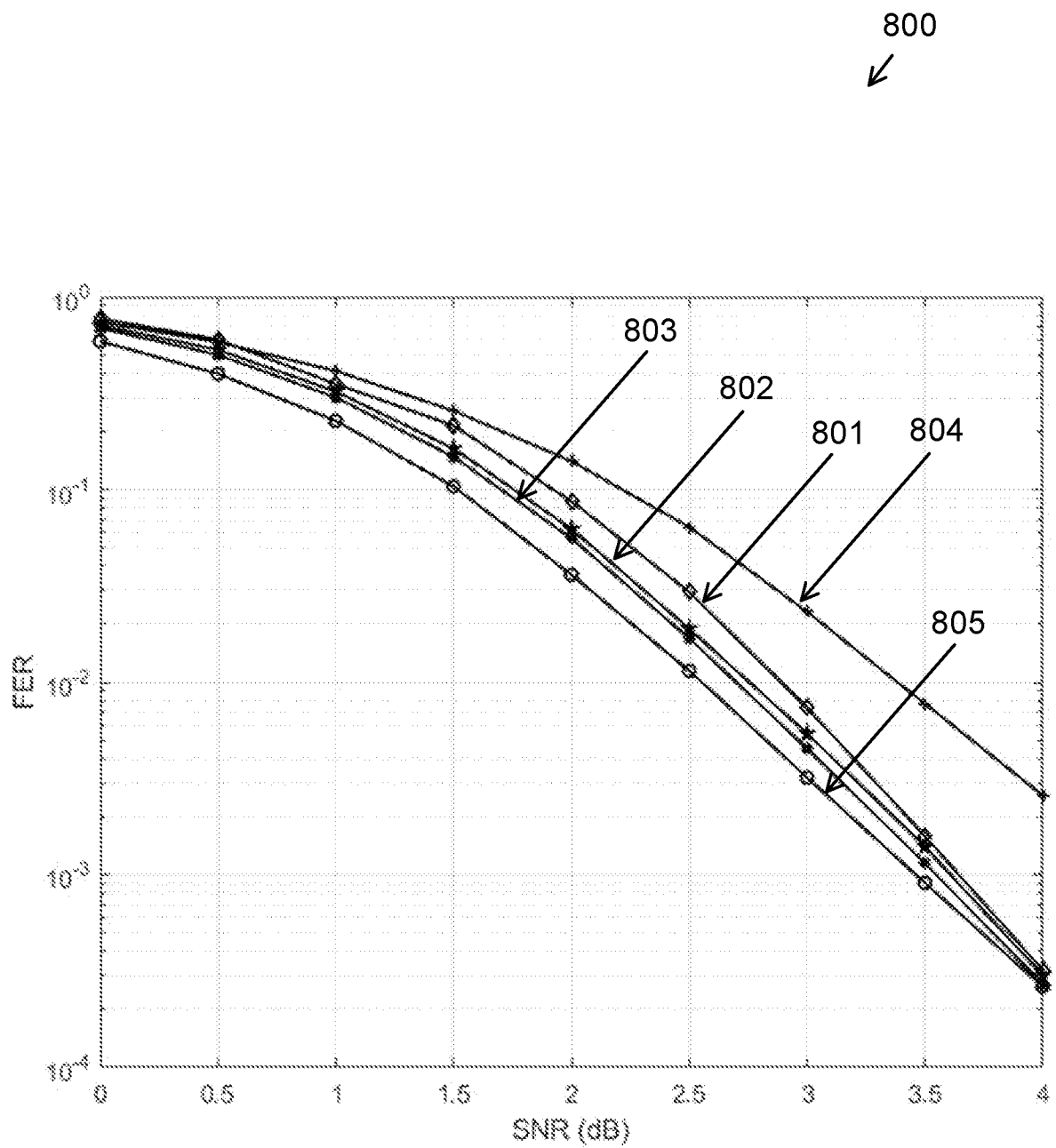
FIG. 8 is a chart illustrating the frame error rate performance in an example team polar decoder in accordance with certain aspects of the present disclosure.

FIG. 8 is a performance chart 800 illustrating the FER performance in an example of the second embodiment of the present principles as described in connection with FIG. 7. The chart 800 presents results of a simulation study in which three instances of the second embodiment are compared with a prior-art SC decoder and a prior-art CA-SCL (CRC-aided SC list) decoder. The three instances of the second embodiment are identical to each other in all respects, except for the number of CPDs they employ. The number of CPDs M equals 8, 16, and 32 for the first, second, and third instances, respectively. All polar codes in the comparison have a common code length N=128 and a common code dimension K=64.

The channel 330 in the simulation study corresponds to a binary phase-shift keying (BPSK) modulation scheme with additive white Gaussian noise (AWGN). The BSPK part of the channel 330 maps the CB $x=(x_1, \ldots, x_N)$ to a BPSK signal $z=(z_1, \ldots, z_N)$ by setting $z_1$ to 1 or −1 depending on $x_1$ being 0 or 1, respectively. Given the BPSK signal z, the AWGN part of the channel 330 produces the NCB y in accordance with the probability density function $$P_{Y|V}(y|z) = \prod_{i=1}^N \frac{1}{\sqrt{\pi N_0}} e^{\frac{(y_i - z_i)^2}{N_0}}$$

where $N_0$ is a noise power spectral density. The person skilled in the art will recognize that such a channel is characterized by a signal-to-noise (SNR) defined as $$\log_{10}\left(\frac{2}{N_0}\right)$$

and measured in decibels (dB). In the simulation study, the SNR ranges from 0 to 4 dB in steps of 0.5 dB.

The data, frozen, and parity-check index sets in all three instances of the second embodiment in the simulation study are given by A={31, 32, 44, 46, 47, 48, 52, 54, 55, 56, 57, 58, 59, 60, 61, 62, 63, 64, 72, 76, 78, 79, 80, 83, 84, 85, 86, 87, 88, 89, 90, 91, 92, 93, 94, 95, 96, 98, 99, 100, 101, 102, 103, 104, 105, 106, 107, 108, 109, 110, 111, 112, 113, 114, 115, 116, 117, 118, 119, 120, 121, 122, 123, 124}, B={1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 33, 34, 35, 36, 37, 38, 39, 40, 41, 42, 43, 45, 49, 50, 51, 53, 65, 66, 67, 68, 69, 70, 71, 73, 74, 75, 77, 81, 82, 97}, and C={125, 126, 127, 128}. These index sets are obtained by the density-evolution method optimized for operation at 2 dB SNR on the above BPSK-AWGN channel. The parity-check is a 4-bit CRC with a generator polynomial $g(x)=1+x+x^2+x^3$.

In all three instances of the second embodiment, encoding is non-systematic and the mth CDDB $\hat{d}^{(m)}$ is obtained by setting $\hat{d}^{(m)} = \hat{u}_A^{(m)} = (\hat{u}_i^{(m)} : i \in A)$. The mth RI $r^{(m)}$ is computed as $$r^{(m)} = \sum_{i=1}^N (y_i - \hat{z}_i)^2$$

where $\hat{z}=(\hat{z}_1, \hat{z}_2, \ldots, \hat{z}_N)$ is the BSPK signal obtained by re-encoding and re-modulating the mth DTIB $\hat{u}^{(m)}$. Here, smaller values of the RI indicate a more reliable decision.

The curves 801, 802 and 803 show the FER performances of the first, second, and third instances of the second embodiment, respectively. The curve 805 shows the FER performance of a CA-SCL decoder with a list of size 8. The polar code for the CA-SCL decoder is the same as the polar code in the three instances of the second embodiment. The curve 804 belongs to an SC decoder which is configured to decode a polar code with code length N=128, code dimension K=64, and with no parity checks. The polar code under SC decoding has a frozen index set B'=B∪{44, 57, 83, 98} (where B is the frozen index set for the three instances of the second embodiment as defined above) and a data index set A' given by the complement of B'.

We observe that the FER performances of the TPD 430 in all three instances of the second embodiment of the present principles (curves 801, 802, 803) are significantly better than that of the SC decoder (curve 804). This illustrates the practical utility of the present principles over SC decoding. The FER performance in the three instances of the second embodiment falls short of that of the CA-SCL decoder (curve 805); this is to be expected since the SCL decoder uses a more complex search method. The present principles make up for the deficit in FER performance by reduced search complexity which translates to a higher decoder throughput. This concludes the discussion of FIG. 8.

We conclude the description of the present principles by pointing out some implementation options that are not covered by the above embodiments of the present principles.

In some embodiments of the present principles, it may be advantageous to eliminate duplicate computations and storage by allowing team members to share computational modules, e.g., for metric calculations. Such a resource-sharing approach may significantly reduce hardware complexity at a slight increase in the communication overhead.

In some embodiments of the present principles, the TPD 340 may be applied only to certain portions of a polar code rather than to the entire polar code. For example, a first TPD 340 may be used to decode the first half of the polar code (consisting of the first N/2 symbols), while the second half is decoded by a second TPD 340 (with a different configuration). The present principles are general enough to avoid splitting at certain steps of decoding by choosing a splitting test or a splitting distribution at such steps accordingly.

In some embodiments of the present principles, early termination may be employed when errors are detected. The CPDs may employ an early termination test after decoding each segment and quit decoding if the test result indicates that the current decoding path is unlikely to be correct. Early termination saves energy. In an extended version of the present principles, those CPDs that early-terminate may rejoin the decoding effort as part of other teams.

In a generalization of the present principles, the CPDs may employ more general decoding rules, such SCL decoding, instead of the SC decoding rules. For example, such a generalization may aim to achieve the performance of an SCL decoder with a list size 32 by using component SCL decoders, each with a small list size, such as 2 or 4.

While the particular METHOD AND APPARATUS FOR DECODING OF POLAR CODES is herein described in detail and is depicted in the drawings, it is to be understood that the subject matter which is encompassed by the present disclosure is limited only by the claims.

Although the present disclosure has been described with exemplary embodiments, various changes and modifications may be suggested to one skilled in the art. It is intended that the present disclosure encompass such changes and modifications that fall within the scope of the appended claims. The description in the present application should not be read as implying that any particular element, step, or function is an essential or critical element which must be included in the claim scope: the scope of patented subject matter is defined only by the allowed claims.

Moreover, none of these claims are intended to invoke 35 USC § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

What is claimed is:

1. A team polar decoder (TPD) apparatus for use in a communication system, the TPD apparatus comprising:
 a plurality of polar decoders (PPDs), connected to a channel; and
 a team decision maker (TDM) connected to the PPDs and a destination,
 wherein the PPDs comprise an mth component polar decoder (CPD) for each value $m \in [1, M]$ of a CPD index, wherein M is a number of CPDs, wherein $[1, M]$ is a CPD index set,
 wherein the PPDs are configured to decode a polar code in accordance with a partition $(I_1, I_2, \ldots, I_S)$ of a polar code index set $[1, N]$, wherein N is a code length for the polar code, wherein S is a partition size,
 wherein, for each $m \in [1, M]$, the mth CPD is configured to receive a noisy code block (NCB) y from the channel, and decode the NCB y in S consecutive steps to obtain an mth decoded transform input block (DTIB) $\hat{u}^{(m)} = (\hat{u}_1^{(m)}, \hat{u}_2^{(m)}, \ldots, \hat{u}_N^{(m)})$, wherein, for each $s \in [1, S]$, in an sth step of decoding, the mth CPD decodes an (m, s)th segment $\hat{u}_{I_s}^{(m)} = \hat{u}_i^{(m)} : i \in I_s$ of the mth DTIB $\hat{u}^{(m)}$,
 wherein, for each $s \in [1, S]$, in the sth step of decoding, the mth CPD computes an (m, s)th metric $\gamma_s^{(m)}$ and decodes the (m, s)th segment $\hat{u}_{I_s}^{(m)}$ in accordance with an identifier $v_{I_s}$ of a subinterval in an (m, s−1)th partition of an (m, s−1)th interval into disjoint subintervals such that the subinterval with identifier $v_{I_s}$ contains an (m, s−1)th position variable $q_{s-1}^{(m)}$, wherein the (m, s−1)th partition of the (m, s−1)th interval is chosen in accordance with an (m, s)th splitting distribution $Q_s^{(m)}$, wherein the (m, s)th splitting distribution $Q_s^{(m)}$ is a probability distribution on a set of all possible values of the (m, s)th segment $\hat{u}_{I_s}^{(m)}$,
 wherein the mth CPD is associated with an (m, s)th team $T_s^{(m)}$ for each $s \in [0, S]$, wherein the (m, s)th team $T_s^{(m)}$ is a subset of the CPD index set $[1, M]$, wherein, for $s \in [1, S]$, the (m, s)th team $T_s^{(m)}$ contains a CPD index $h \in [1, M]$ if and only if, for each $j \in [1, s]$, the (h, j)th segment $\hat{u}_{I_j}^{(h)}$ of the hth DTIB $\hat{u}^{(h)}$ decoded by the hth CPD has the same value as the (m, j)th segment $\hat{u}_{I_j}^{(m)}$ of the mth DTIB $\hat{u}^{(m)}$ decoded by the mth CPD, wherein the (m, 0)th team $T_0^{(m)}$ equals the CPD index set $[1, M]$,
 wherein, for any $s \in [1, S]$, the (m, s)th metric $\gamma_s^{(m)}$, the (m, s−1)th interval, the (m, s−1)th partition of the (m, s−1)th interval, and the (m, s)th splitting distribution $Q_s^{(m)}$ are common to all members of the (m, s−1)th team $T_{s-1}^{(m)}$ in the sense that, for any CPD index $h \in T_{s-1}^{(m)}$, the (h, s)th metric $\gamma_s^{(h)}$ equals the (m, s)th metric $\gamma_s^{(m)}$, the (h, s−1)th interval equals the (m, s−1)th interval, the (h, s−1)th partition of the (h, s−1)th interval is the same as the (m, s−1)th partition of the (m, s−1)th interval, and the (h, s)th splitting distribution $Q_s^{(h)}$ is the same as the (m, s)th splitting distribution $Q_s^{(m)}$,
 wherein, for each $m \in [1, M]$, the mth CPD is further configured to generate, at an end of the Sth step of decoding, an mth candidate decoded data block (CDDB) $\hat{d}^{(m)}$ from the mth DTIB $\hat{u}^{(m)}$ by a data-demapping operation and send the mth CDDB $\hat{d}^{(m)}$ to the TDM, wherein the data-demapping operation is an inverse of a data-mapping operation applied at a polar encoder (PE) in the communication system, wherein the plurality of CDDBs $(\hat{d}^{(1)}, \hat{d}^{(2)}, \ldots, \hat{d}^{(M)})$ contain at least two distinct CDDBs, and wherein the TDM is configured to receive the plurality of CDDBs ($\hat{d}^{(1)}, \hat{d}^{(2)}, \ldots, \hat{d}^{(M)}$) from the PPDs, generate a decoded data block (DDB) $\hat{d}$, and send the DDB d to the destination.

2. The TPD apparatus of claim 1, wherein, for each $m \in [1, M]$, the mth CPD is further configured to generate an mth reliability indicator (RI) $r^{(m)}$ and send the mth RI $r^{(m)}$ to the TDM together with the mth CDDB $\hat{d}^{(m)}$ wherein the mth RI $r^{(m)}$ is a measure of confidence that the mth CDDB $\hat{d}^{(m)}$ equals a data block (DB) d produced by a source in the communication system, wherein the TDM is further configured to receive the plurality of RIs ($r^{(1)}, r^{(2)}, \ldots, r^{(M)}$) and utilize the plurality of RIs ($r^{(1)}, r^{(2)}, \ldots, r^{(M)}$) in generating the DDB $\hat{d}$.

3. The TPD apparatus of claim 1, wherein the PPDs are equipped with a total order relation, wherein, for $s \in [1, S]$, the mth CPD is further configured to decode the (m, s)th segment $\hat{u}_{I_s}^{(m)}$ by setting the (m, s)th segment $\hat{u}_{I_s}^{(m)}$ equal to the smallest value $v_{I_s}$ with respect to the total order relation such that the inequality $q_{s-1}^{(m)} \leq L_{s-1}^{(m)} \cdot \Sigma \tilde{v}_{I_s} \leq v_{I_s} Q_{s-1}^{(m)}(\tilde{v}_{I_s})$ is satisfied by the (m, s−1)th position variable $q_{s-1}^{(m)}$, an (m, s−1)th team size variable $L_{s-1}^{(m)}$, and the (m, s)th splitting distribution $Q_s^{(m)}$, wherein the (m, s−1)th team size variable $L_{s-1}^{(m)}$, is a size of the (m, s−1)th team $T_{s-1}^{(m)}$, wherein the sum $\Sigma \tilde{v}_{I_s} \leq v_{I_s} Q_s^{(m)}(\tilde{v}_{I_s})$ is over all values of $\tilde{v}_{I_s}$ that are smaller than or equal to $v_{I_s}$ with respect to the total order relation.

4. The TPD apparatus of claim 1, wherein the code length and the partition size satisfy $S \geq N/8$ and the number of CPDs satisfies $M \geq 4$.

5. A method performed by a team polar decoder (TPD) apparatus in a communication system, the method comprising:
receiving, at a plurality of polar decoders (PPDs) connected to a channel, a noisy code block (NCB) y from the channel; and
decoding, using a team decision maker (TDM) connected to the PPDs and a destination, the NCB y,
wherein the PPDs comprise an mth component polar decoder (CPD) for each value $m \in [1, M]$ of a CPD index, wherein M is a number of CPDs, wherein [1, M] is a CPD index set,
wherein the PPDs are configured to decode a polar code in accordance with a partition $I_1, I_2, \ldots, I_S$ of a polar code index set [1, N], wherein N is a code length for the polar code, wherein S is a partition size,
wherein, for each $m \in [1, M]$, the mth CPD is configured to receive the noisy code block (NCB) y from the channel, and decode the NCB y in S consecutive steps to obtain an mth decoded transform input block (DTIB) $\hat{u}^{(m)} = (\tilde{u}_1^{(m)}, \tilde{u}_2^{(m)}, \ldots, \tilde{u}_N^{(m)})$, wherein, for each $s \in [1, S]$, in an sth step of decoding, the mth CPD decodes an (m, s)th segment $\tilde{u}_{I_s}^{(m)} = \tilde{u}_i^{(m)} : i \in I_s$ of the mth DTIB $\tilde{u}^{(m)}$,
wherein, for each $s \in [1, S]$, in the sth step of decoding, the mth CPD computes an (m, s)th metric $\gamma_s^{(m)}$ and decodes the (m, s)th segment $\tilde{u}_{I_s}^{(m)}$ in accordance with an identifier $v_{I_s}$ of a subinterval in an (m, s−1)th partition of an (m, s−1)th interval into disjoint subintervals such that the subinterval with identifier $v_{I_s}$ contains an (m, s−1)th position variable $q_{s-1}^{(m)}$, wherein the (m, s−1)th partition of the (m, s−1)th interval is chosen in accordance with an (m, s)th splitting distribution $Q_s^{(m)}$, wherein the (m, s)th splitting distribution $Q_s^{(m)}$ is a probability distribution on a set of all possible values of the (m, s)th segment $\tilde{u}_{I_s}^{(m)}$, wherein the mth CPD is associated with an (m, s)th team $T_s^{(m)}$ for each $s \in [0, S]$, wherein the (m, s)th team $T_s^{(m)}$ is a subset of the CPD index set [1, M], wherein, for $s \in [1, S]$, the (m, s)th team $T_s^{(m)}$ contains a CPD index $h \in [1, M]$ if and only if, for each $j \in [1, s]$, the (h, j)th segment $\tilde{u}_{I_j}^{(h)}$ of the hth DTIB $\hat{u}^{(h)}$ decoded by the hth CPD has the same value as the (m, j)th segment $\tilde{u}_{I_j}^{(m)}$ of the mth DTIB $\tilde{u}^{(m)}$ decoded by the mth CPD, wherein the (m, 0)th team $T_0^{(m)}$ equals the CPD index set [1, M], wherein, for any $s \in [1, S]$, the (m, s)th metric $\gamma_s^{(m)}$, the (m, s−1)th interval, the (m, s−1)th partition of the (m, s−1)th interval, and the (m, s)th splitting distribution $Q_s^{(m)}$ are common to all members of the (m, s−1)th team $T_{s-1}^{(m)}$ in the sense that, for any CPD index $h \in T_{s-1}^{(m)}$, an (h, s)th metric $\gamma_s^{(h)}$ equals the (m, s)th metric $\gamma_s^{(m)}$, the (h, s−1)th interval equals the (m, s−1)th interval, the (h, s−1)th partition of the (h, s−1)th interval is the same as the (m, s−1)th partition of the (m, s−1)th interval, and the (h, s)th splitting distribution $Q_s^{(h)}$ is the same as the (m, s)th splitting distribution $Q_s^{(m)}$, wherein, for each $m \in [1, M]$, the mth CPD is further configured to generate, at an end of the Sth step of decoding, an mth candidate decoded data block (CDDB) $\hat{d}^{(m)}$ from the mth DTIB $\hat{u}^{(m)}$ by a data-demapping operation and send the mth CDDB $\hat{d}^{(m)}$ to the TDM, wherein the data-demapping operation is an inverse of a data-mapping operation applied at a polar encoder (PE) in the communication system, wherein the plurality of CDDBs ($\hat{d}^{(1)}, \hat{d}^{(2)}, \ldots, \hat{d}^{(M)}$) contain at least two distinct CDDBs, and wherein the TDM is configured to receive the plurality of CDDBs ($\hat{d}^{(1)}, \hat{d}^{(2)}, \ldots, \hat{d}^{(M)}$) from the PPDs, generate a decoded data block (DDB) $\hat{d}$, and send the DDB d to the destination.

6. The method of claim 5, wherein, for each $m \in [1, M]$, the mth CPD is further configured to generate an mth reliability indicator (RI) $r^{(m)}$ and send the mth RI $r^{(m)}$ to the TDM together with the mth CDDB $\hat{d}^{(m)}$, wherein the mth RI $r^{(m)}$ is a measure of confidence that the mth CDDB $\hat{d}^{(m)}$ equals a data block (DB) d produced by a source in the communication system, wherein the TDM is further configured to receive the plurality of RIs ($r^{(1)}, r^{(2)}, \ldots, r^{(M)}$) and utilize the plurality of RIs ($r^{(1)}, r^{(2)}, \ldots, r^{(M)}$) in generating the DDB $\hat{d}$.

7. The method of claim 5, wherein the PPDs are equipped with a total order relation, wherein, for $s \in [1, S]$, the mth CPD is further configured to decode the (m, s)th segment $\hat{u}_{I_s}^{(m)}$ by setting the (m, s)th segment $\hat{u}_{I_s}^{(m)}$ equal to the smallest value $v_{I_s}$ with respect to the total order relation such that the inequality $q_{s-1}^{(m)} \leq L_{s-1}^{(m)} \cdot \Sigma \tilde{v}_{I_s} \leq v_{I_s} Q_{s-1}^{(m)}(\tilde{v}_{I_s})$ is satisfied by the (m, s−1)th position variable $q_{s-1}^{(m)}$, an (m, s−1)th team size variable $L_{s-1}^{(m)}$, and the (m, s)th splitting distribution $Q_s^{(m)}$, wherein the (m, s−1)th team size variable $L_{s-1}^{(m)}$, is a size of the (m, s−1)th team $T_{s-1}^{(m)}$, wherein the sum $\Sigma \tilde{v}_{I_s} \leq v_{I_s} Q_s^{(m)}(\tilde{v}_{I_s})$ is over all values of $\tilde{v}_{I_s}$ that are smaller than or equal to $v_{I_s}$ with respect to the total order relation.

8. The method of claim 5, wherein the code length and the partition size satisfy $S \geq N/8$ and the number of CPDs satisfies $M \geq 4$.

* * * * *